United States Patent
Choi et al.

(10) Patent No.: US 10,846,229 B1
(45) Date of Patent: Nov. 24, 2020

(54) MEMORY DEVICE AND OPERATING METHOD OF THE MEMORY DEVICE

(71) Applicant: SK hynix Inc., Icheon-si (KR)

(72) Inventors: Won Jae Choi, Icheon-si (KR); Tae Heui Kwon, Seoul (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/698,743

(22) Filed: Nov. 27, 2019

(30) Foreign Application Priority Data

Jun. 7, 2019 (KR) .................. 10-2019-0067347

(51) Int. Cl.
| | |
|---|---|
| *G11C 7/10* | (2006.01) |
| *G06F 12/0882* | (2016.01) |
| *G06F 12/0831* | (2016.01) |
| *G06F 13/16* | (2006.01) |
| *G11C 7/06* | (2006.01) |
| *G11C 11/4093* | (2006.01) |
| *G11C 11/4074* | (2006.01) |
| *G06F 13/40* | (2006.01) |

(52) U.S. Cl.
CPC ...... *G06F 12/0882* (2013.01); *G06F 12/0831* (2013.01); *G06F 13/1673* (2013.01); *G06F 13/4077* (2013.01); *G11C 7/065* (2013.01); *G11C 7/1072* (2013.01); *G11C 11/4074* (2013.01); *G11C 11/4093* (2013.01)

(58) Field of Classification Search
CPC ............. G06F 12/0882; G06F 12/0831; G06F 13/1673; G06F 13/4077; G11C 7/065; G11C 7/1072; G11C 11/4074

USPC .................................................. 365/189.05
See application file for complete search history.

(56) References Cited

U.S. PATENT DOCUMENTS

2012/0099387 A1\* 4/2012 Shim ................ H01L 27/11582
365/189.05

FOREIGN PATENT DOCUMENTS

| KR | 100626371 B1 | 9/2006 |
|---|---|---|
| KR | 100704028 B1 | 4/2007 |

\* cited by examiner

*Primary Examiner* — Xiaochun L Chen
(74) *Attorney, Agent, or Firm* — William Park & Associates Ltd.

(57) ABSTRACT

A memory device controls a page buffer to ensure the reliability of data. The memory device includes: a memory cell array including a plurality of memory cells configured for storing data; first and second page buffers respectively including main latches and cache latches, which are coupled to a bus, the first and second page buffers being connected to the memory cell array respectively through bit lines coupled to the main latches; and control logic including a bus precharge controller for differently setting a voltage level of the bus, based on a distance between a reference position and the first page buffer and a distance between the reference position and the second page buffer, for precharging of the bus for transmitting data of a cache latch included in each of the first and second page buffers to a corresponding main latch.

20 Claims, 22 Drawing Sheets

FIG. 10A

| DISTANCE BETWEEN PAGE BUFFER AND CONTROL LOGIC (PBCL_LTH) | BUS PRECHARGE VOLTAGE (BP_VOL) |
|---|---|
| PBCL_LTH1 | BP_VOL1 |
| PBCL_LTH2 | BP_VOL2 |
| PBCL_LTH3 | BP_VOL3 |
| PBCL_LTH4 | BP_VOL4 |

FIG. 10B

| DISTANCE BETWEEN PAGE BUFFER AND CONTROL LOGIC (PBCL_LTH) | BUS PRECHARGE TIME (BP_TIME) |
|---|---|
| PBCL_LTH1 | BP_TIME1 |
| PBCL_LTH2 | BP_TIME2 |
| PBCL_LTH3 | BP_TIME3 |
| PBCL_LTH4 | BP_TIME4 |

FIG. 13A

| DISTANCE BETWEEN PAGE BUFFER AND CONTROL LOGIC (PBCL_LTH) | EVALUATION TIME (EVAL_TIME) |
|---|---|
| PBCL_LTH1 | EVAL_TIME1 |
| PBCL_LTH2 | EVAL_TIME2 |
| PBCL_LTH3 | EVAL_TIME3 |
| PBCL_LTH4 | EVAL_TIME4 |

FIG. 13B

| DISTANCE BETWEEN PAGE BUFFER AND CONTROL LOGIC (PBCL_LTH) | ACQUISITION TIME (CTH_TIME) |
|---|---|
| PBCL_LTH1 | CTH_TIME1 |
| PBCL_LTH2 | CTH_TIME2 |
| PBCL_LTH3 | CTH_TIME3 |
| PBCL_LTH4 | CTH_TIME4 |

MEMORY DEVICE AND OPERATING METHOD OF THE MEMORY DEVICE

CROSS-REFERENCE TO RELATED APPLICATION

The present application claims priority under 35 U.S.C. § 119(a) to Korean patent application number 10-2019-0067347, filed on Jun. 7, 2019, in the Korean Intellectual Property Office, the entire disclosure of which is incorporated herein by reference.

BACKGROUND

1. Technical Field

The present disclosure generally relates to an electronic device, and more particularly, to a memory device and an operating method of the memory device.

2. Related Art

A storage device is a device configured to store data under the control of a host device such as a computer, a smart phone or a smart pad. The storage device includes a device configured to store data on a magnetic disk, such as a Hard Disk Drive (HDD), and a device configured to store data on a semiconductor memory, i.e., a nonvolatile memory, such as a Solid State Drive (SSD) or a memory card.

The storage device may include a memory device configured to store data and a memory controller configured to control the memory device. The memory device is classified into a volatile memory device and a nonvolatile memory device. The nonvolatile memory device includes a Read Only Memory (ROM), a Programmable ROM (PROM), an Electrically Programmable ROM (EPROM), an Electrically Erasable and Programmable ROM (EEPROM), a flash memory, a Phase-change RAM (PRAM), a Magnetic RAM (MRAM), a Resistive RAM (RRAM), a Ferroelectric RAM (FRAM), and the like.

SUMMARY

In accordance with an aspect of the present disclosure, there may be provided a memory device including: a memory cell array including a plurality of memory cells configured for storing data; first and second page buffers respectively including main latches and cache latches, which are coupled to a bus, the first and second page buffers being connected to the memory cell array respectively through bit lines coupled to the main latches; and control logic including a bus precharge controller configured to differently set a voltage level of the bus, based on a distance between a reference position and the first page buffer and a distance between the reference position and the second page buffer, for precharging of the bus for transmitting data of a cache latch included in each of the first and second page buffers to a corresponding main latch.

In accordance with another aspect of the present disclosure, there may be provided a memory device including: a memory cell array including a plurality of memory cells configured for storing data; first and second page buffers respectively including main latches and cache latches, which are coupled to a bus, the first and second page buffers being connected to the memory cell array respectively through bit lines coupled to the main latches; and a control logic including a latch controller configured to generate an evaluation signal and an acquisition signal, which are used to transmit data stored in any one of the cache latches to any one of the main latches, based on positions of the first page buffer and the second page buffer.

In accordance with still another aspect of the present disclosure, there may be provided a method for operating a memory device, the method including: receiving data to be stored in a plurality of memory cells included in a memory cell array; setting a voltage level of a bus precharged to transmit data stored in any one of cache latches to any one of main latches, based on positions of first and second page buffers, wherein the first and second page buffers respectively include the main latches and the cache latches, which are coupled to the bus, and are coupled to the memory cell array respectively through bit lines coupled to the main latches; and generating a power voltage applied to the bus and a bus precharge signal for turning on a bus precharge transistor coupled to the bus, according to the voltage level of the bus.

In accordance with an aspect of the present disclosure, there may be provided a memory device including: a memory cell array including a plurality of memory cells configured for storing data; first and second page buffers respectively including main latches and cache latches, which are coupled to a bus, the first and second page buffers being connected to the memory cell array respectively through bit lines coupled to the main latches; and control logic including a bus precharge controller configured to differently set a duration of a power voltage applied to the bus, based on a distance between a reference position and the first page buffer and a distance between the reference position and the second page buffer, for precharging of the bus for transmitting data of a cache latch included in each of the first and second page buffers to a corresponding main latch.

In accordance with an aspect of the present disclosure, there may be provided a memory device including: a memory cell array including a plurality of memory cells configured for storing data; first and second page buffers respectively including main latches and cache latches, the main latches and cache latches respectively coupled to a bus through evaluation transistors and acquisition transistors, the first and second page buffers being connected to the memory cell array respectively through bit lines coupled to the main latches; and control logic including a latch controller configured to differently set a duration of an evaluation time and an acquisition time, based on a distance between a reference position and the first page buffer and a distance between the reference position and the second page buffer, for which an evaluation signal is applied to a gate of an evaluation transistor and an acquisition signal is applied to a gate of an acquisition transistor for transmitting or receiving data to or from a cache latch included in each of the first and second page buffers to or from a corresponding main latch.

BRIEF DESCRIPTION OF THE DRAWINGS

Examples of embodiments will now be described more fully hereinafter with reference to the accompanying drawings; however, they may be embodied in different forms and should not be construed as limited to the embodiments set forth herein.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIGS. 10A and 10B are diagrams illustrating a bus precharge voltage and a bus precharge time.

FIGS. 13A and 13B are diagrams illustrating an evaluation time and an acquisition time.

DETAILED DESCRIPTION

Figure 1:
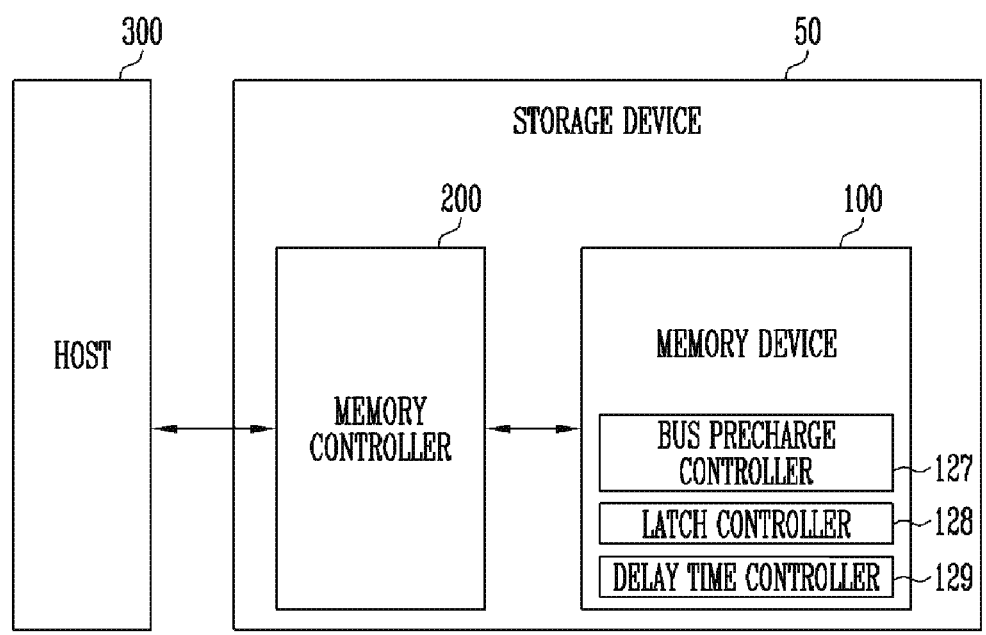
FIG. 1 is a block diagram illustrating a storage device.

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

The embodiments according to the concept of the present disclosure can be variously modified and have various shapes. Thus, the embodiments are illustrated in the drawings and are intended to be described herein in detail. However, the embodiments according to the concept of the present disclosure are not construed as limited to specified disclosures, and include all changes, equivalents, or substitutes that do not depart from the spirit and technical scope of the present disclosure.

While terms such as "first" and "second" may be used to describe various components, such components must not be understood as being limited to the above terms. The above terms are used only to distinguish one component from another. For example, a first component may be referred to as a second component without departing from the scope of rights of the present disclosure, and likewise a second component may be referred to as a first component.

It will be understood that when an element is referred to as being "connected" or "coupled" to another element, it can be directly connected or coupled to the other element or intervening elements may also be present. In contrast, when an element is referred to as being "directly connected" or "directly coupled" to another element, no intervening elements are present. Meanwhile, other expressions describing relationships between components such as "~ between," "immediately ~ between" or "adjacent to ~" and "directly adjacent to ~" may be construed similarly.

The terms used in the present application are merely used to describe particular embodiments, and are not intended to limit the present disclosure. Singular forms in the present disclosure are intended to include the plural forms as well, unless the context clearly indicates otherwise. It will be further understood that terms such as "including" or "having," etc., are intended to indicate the existence of the features, numbers, operations, actions, components, parts, or combinations thereof disclosed in the specification, and are not intended to preclude the possibility that one or more other features, numbers, operations, actions, components, parts, or combinations thereof may exist or may be added.

So far as not being differently defined, all terms used herein including technical or scientific terminologies have meanings that they are commonly understood by those skilled in the art to which the present disclosure pertains. The terms having the definitions as defined in the dictionary should be understood such that they have meanings consistent with the context of the related technique. So far as not being clearly defined in this application, terms should not be understood in an ideally or excessively formal way.

In describing those embodiments, description will be omitted for techniques that are well known to the art to which the present disclosure pertains, and are not directly related to the present disclosure. This intends to disclose the gist of the present disclosure more clearly by omitting unnecessary description.

Hereinafter, examples of embodiments of the present disclosure will be described with reference to the accompanying drawings in order for those skilled in the art to be able to readily implement the technical spirit of the present disclosure.

Embodiments provide a memory device for controlling a page buffer to ensure the reliability of data and an operating method of the memory device.

FIG. 1 is a block diagram illustrating a storage device.

Referring to FIG. 1, the storage device 50 may include a memory device 100, a memory controller 200, and a buffer memory.

The storage device 50 may be a device for storing data under the control of a host 300, such as a mobile phone, a smart phone, an MP3 player, a laptop computer, a desktop computer, a game console, a TV, a tablet PC or an in-vehicle infotainment.

The storage device 50 may be manufactured as any one of various types of storage devices according to a host interface that is a communication scheme with the host 300. For example, the storage device 50 may be implemented with any one of a variety of types of storage devices, such as a Solid State Drive (SSD), a Multi-Media Card (MMC), an Embedded MMC (eMMC), a Reduced Size MMC (RS-MMC), a micro-MMC (micro-MMC), a Secure Digital (SD) card, a mini-SD card, a micro-SD card, a Universal Serial Bus (USB) storage device, a Universal Flash Storage (UFS) device, a Compact Flash (CF) card, a Smart Media Card (SMC), a memory stick, and the like.

The storage device 50 may be manufactured as any one of various types of storage devices according to a host interface that is a communication scheme with the host 300. For example, the storage device 50 may be implemented with any one of a variety of types of storage devices, such as a Solid State Drive (SSD), a Multi-Media Card (MMC), an Embedded MMC (eMMC), a Reduced Size MMC (RS-MMC), a micro-MMC (micro-MMC), a Secure Digital (SD) card, a mini-SD card, a micro-SD card, a Universal Serial Bus (USB) storage device, a Universal Flash Storage (UFS) device, a Compact Flash (CF) card, a Smart Media Card (SMC), a memory stick, and the like.

The memory device 100 may store data. The memory device 100 operates under the control of the memory controller 200. The memory device 100 may include a memory cell array including a plurality of memory cells for storing data. The memory cell array may include a plurality of memory blocks. Each memory block may include a plurality of memory cells. One memory block may include a plurality of pages. In an embodiment, the page may be a unit for storing data in the memory device 100 or reading data stored in the memory device 100. The memory block may be a unit for erasing data.

In an embodiment, the memory device 100 may be a Double Data Rate Synchronous Dynamic Random Access Memory (DDR SDRAM), a Low Power Double Data Rate 4 (LPDDR4) SDRAM, a Graphics Double Data Rate (GDDR) SRAM, a Low Power DDR (LPDDR), a Rambus Dynamic Random Access Memory (RDRAM), a NAND flash memory, a vertical NAND flash memory, a NOR flash memory, a Resistive Random Access Memory (RRAM), a Phase-Change Random Access Memory (PRAM), a Magnetoresistive Random Access Memory (MRAM), a Ferroelectric Random Access Memory (FRAM), a Spin Transfer Torque Random Access Memory (STT-RAM), or the like. In this specification, for convenience of description, a case where the memory device 100 is a NAND flash memory is assumed and described.

In an embodiment, the memory device 100 may be implemented in a three-dimensional array structure. The present disclosure may be applied to not only a flash memory device in which a charge storage layer is configured with a Floating Gate (FG) but also a Charge Trap Flash (CTF) in which a charge storage layer is configured with an insulating layer.

In an embodiment, each of the memory cells included in the memory device 100 may be configured as a Single Level Cell (SLC) for storing one data bit. Also, each of the memory cells included in the memory device 100 may be configured as a Multi-Level Cell (MLC) for storing two data bits, a Triple Level Cell (TLC) for storing three data bits, or a Quad Level Cell (QLC) for storing four data bits.

The memory device 100 is configured to receive a command and an address from the memory controller 200 and access an area selected by the address in the memory cell array. That is, the memory device 100 may perform an operation corresponding to the command on the area selected by the address. For example, the memory device 100 may perform a write (program) operation, a read operation, and an erase operation. In the program operation, the memory device 100 may program data in the area selected by the address. In the read operation, the memory device 100 may read data from the area selected by the address. In the erase operation, the memory device 100 may erase data stored in the area selected by the address.

The memory device may include a bus precharge controller 127. The bus precharge controller 127 may differently set a voltage level of a bus for respective page buffers.

Main latches and cache latches may be coupled to the bus. Any one of the main latches and any one of the cache latches may be included in one page buffer. The voltage level of the bus may be differently set for the respective page buffers, based on positions of the page buffers, to transmit data stored in any one of the cache latches to any one of the main latches. The bus precharge controller 127 may precharge the bus, based on the set voltage level of the bus.

A latch controller 128 may generate an evaluation signal TRANC and an acquisition signal TRANM, which are used to transmit data stored in any one of the cache latches coupled to the bus to any one of the main latches. The evaluation signal TRANC may be a signal applied to a gate of an evaluation transistor coupled to each of the cache latches. The acquisition signal TRANM may be a signal applied to a gate of an acquisition transistor coupled to each of the main latches. Data stored in a cache latch may be transmitted to the bus, based on the evaluation signal TRANC, and the data transmitted to the bus may be stored in a main latch, based on the acquisition signal TRANM.

A delay time controller 129 may control an evaluation delay time EDELAY_TIME. The evaluation delay time EDELAY_TIME may be a time from a point of time when the precharge of the bus is ended to a point of time when the transmission of data stored in any one of the cache latches is started through the bus.

In an embodiment, the delay time controller 129 may control a precharge delay time PDELAY_TIME. The precharge delay time PDELAY_TIME may be a time from a point of time when the generation of the acquisition time TRANM is ended and data is stored in the memory cell array to a point of time when the generation of a bus precharge signal PBUS_N is started. The evaluation delay time EDELAY_TIME may be a time from a point of time when the generation of the bus precharge signal PBUS_N is ended to a point of time when the generation of the evaluation signal TRANC is started.

The memory controller 200 may control overall operations of the storage device 50.

When power is applied to the storage device 50, the memory controller 200 may execute firmware (FW). When the memory device 100 is a flash memory device, the memory controller 200 may execute FW such as an FTL for controlling communication between the host 300 and the memory device 100.

In an embodiment, the memory controller 200 may receive data and a Logical Block Address (LBA) from the host 300, and translate the LBA into a Physical Block Address (PBA) representing addresses of memory cells included in the memory device 100, in which data is to be stored. Also, the memory controller 200 may store, in a buffer memory, mapping information that establishes a mapping relationship between the LBA and the PBA.

The memory controller 200 may control the memory device 100 to perform a program operation, a read operation, an erase operation, or the like in response to a request from the host 300. In the program operation, the memory controller 200 may provide a program command, a PBA, and data to the memory device 100. In the read operation, the memory controller 200 may provide a read command and a PBA to the memory device 100. In the erase operation, the memory controller 200 may provide an erase command and a PBA to the memory device 100.

In an embodiment, the memory controller 200 may autonomously generate a program command, an address, and data without any request from the host 300, and transmit the program command, the address, and the data to the memory device 100. For example, the memory controller 200 may provide the command, the address, and the data to the memory device 100 to perform background operations such as a program operation for wear leveling and a program operation for garbage collection.

In an embodiment, the memory controller 200 may control data exchange between the host 300 and the buffer memory. Alternatively, the memory controller 200 may temporarily store system data for controlling the memory device 100 in the buffer memory. For example, the memory controller 200 may temporarily store data input from the host 300 in the buffer memory, and then transmit the data temporarily stored in the buffer memory to the memory device 100.

In various embodiments, the buffer memory may be used as a working memory or cache memory of the memory controller 200. The buffer memory may store codes or commands executed by the memory controller 200. Alternatively, the buffer memory may store data processed by the memory controller 200.

In an embodiment, the buffer memory may be implemented with a Dynamic Random Access Memory (DRAM) such as a Double Data Rate Synchronous DRAM (DDR SDRAM), a DDR4 SDRAM, a Low Power Double Data Rate 4 (LPDDR4) SDRAM, a Graphics Double Data Rate (GDDR) SRAM, a Low Power DDR (LPDDR), or a Rambus Dynamic Random Access Memory (RDRAM), or a Static Random Access Memory (SRAM).

In various embodiments, the storage device 50 may not include the buffer memory. Therefore, volatile memory devices 100 at the outside of the storage device 50 may perform functions of the buffer memory.

In an embodiment, the memory controller 200 may control at least two memory devices 100. The memory controller 200 may control the memory devices according to an interleaving scheme to improve operational performance.

The host 300 may communicate with the storage device 50, using at least one of various communication manners, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a Non-Volatile Memory express (NVMe), a Universal Flash Storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

Figure 2:
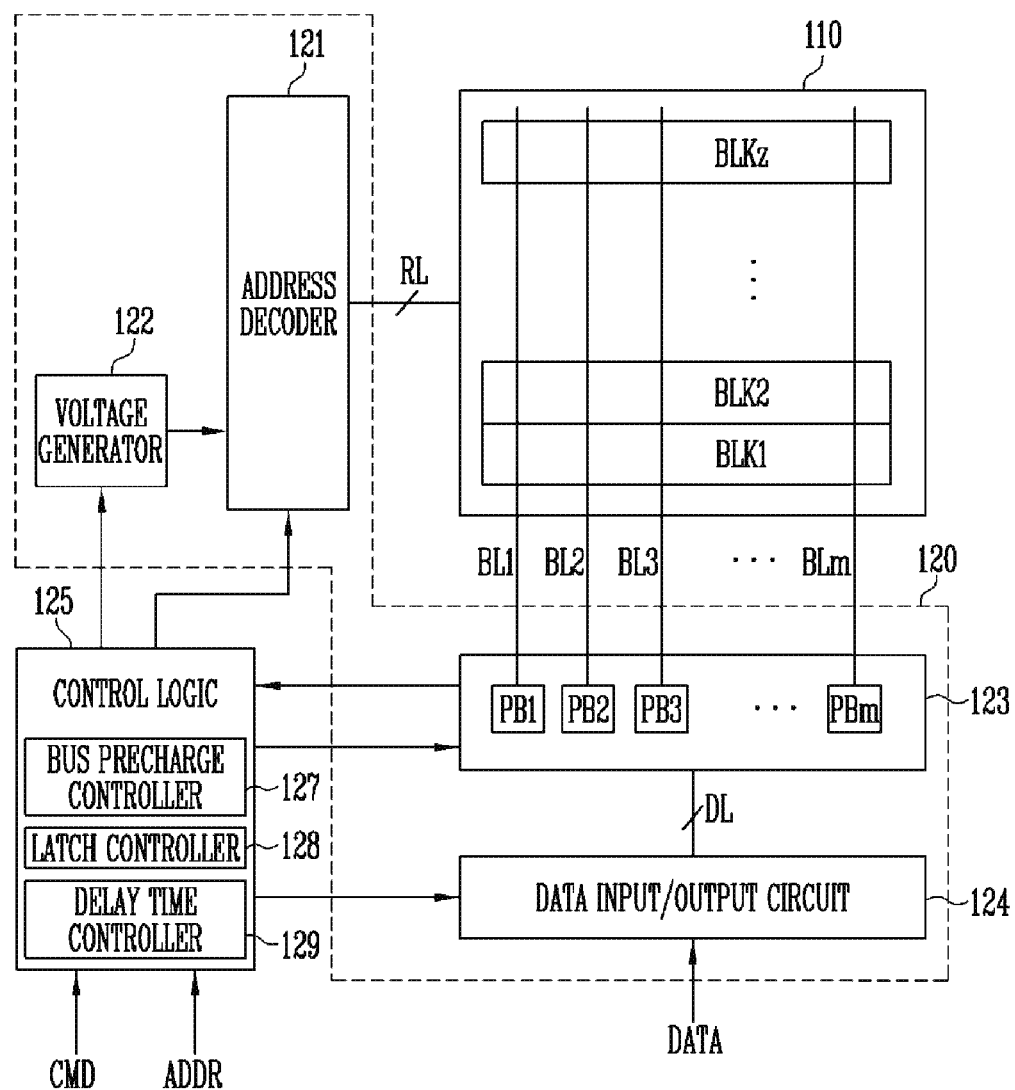
FIG. 2 is a block diagram illustrating a structure of a memory device shown in FIG. 1.

FIG. 2 is a block diagram illustrating a structure of the memory device shown in FIG. 1.

Referring to FIG. 2, the memory device 100 includes a memory cell array 110, a peripheral circuit 120, and control logic 125. The control logic 125 may be implemented as hardware, software, or a combination of hardware and software. For example, the control logic 125 may be a control logic circuit operating in accordance with an algorithm and/or a processor executing control logic code.

The memory cell array 110 may include a plurality of memory blocks BLK1 to BLKz. The plurality of memory blocks BLK1 to BLKz are coupled to an address decoder 121 through row lines RL, and are coupled to a read/write circuit 123 through bit lines BL1 to BLm. Each of the plurality of memory blocks BLK1 to BLKz includes a plurality of memory cells. In an embodiment, the plurality of memory cells are nonvolatile memory cells.

A plurality of memory cells included in the memory cell array may be divided into a plurality of blocks according to usage thereof. System information as various setting information necessary to control the memory device 100 may be stored in the plurality of blocks.

Each of first to zth memory blocks BLK1 to BLKz includes a plurality of cell strings. First to mth cell strings are coupled to first to mth bit lines BL1 to BLm, respectively. Each of the first to mth cell strings includes a drain select transistor, a plurality of memory cells coupled in series, and a source select transistor. The drain select transistor is coupled to a drain select line. First to nth memory cells are coupled to first to nth word lines. The source select transistor is coupled to a source select line. A drain side of the drain select transistor is coupled to a corresponding bit line. The drain select transistors of the first to mth cell strings are coupled to the first to mth bit lines BL1 to BLm, respectively. A source side of the source select transistor is coupled to a common source line. In an embodiment, the common source line may be commonly coupled to the first to zth memory blocks BLK1 to BLKz. The drain select line DSL, the first to nth word lines, and the source select line are included in the row lines RL. The drain select line DSL, the first to nth word lines, and the source select line are controlled by the address decoder 121. The common source line is controlled by the control logic 125. The first to mth bit lines BL1 to BLm are controlled by the read/write circuit 123.

The peripheral circuit 120 includes the address decoder 121, a voltage generator 122, the read/write circuit 123, and a data input/output circuit 124.

The address decoder 121 is coupled to the memory cell array 110 through the row lines RL. The address decoder 121 is configured to operate under the control of the control logic 125. The address decoder 121 receives an address ADDR through the control logic 125.

In an embodiment, a program operation and a read operation of the memory device 100 are performed in units of pages.

In the program and read operations, the address ADDR received by the control logic 125 may include a block address and a row address. The address decoder 121 is configured to decode the block address in the received address ADDR. The address decoder 121 selects one memory block among the memory blocks BLK1 to BLKz according to the decoded block address.

The address decoder 121 is configured to decode the row address in the received address ADDR. The address decoder 121 selects one word line of a selected memory block by applying voltages provided from the voltage generator 122 to the row lines RL according to the decoded row address.

In an erase operation, the address ADDR includes a block address. The address decoder 121 decodes the block address, and selects one memory block according to the decoded block address. The erase operation may be performed on the whole or a portion of the one memory block.

In a partial erase operation, the address ADDR may include block and row addresses. The address decoder 121 selects one memory block among the memory blocks BLK1 to BLKz according to the block address.

The address decoder 121 is configured to decode the row addresses in the received address ADDR. The address decoder 121 selects at least one word line of the selected memory block by applying voltages provided from the voltage generator 122 to the row lines RL according to the decoded row addresses.

In an embodiment, the address decoder 121 may include a block decoder, a word line decoder, an address buffer, and the like.

The voltage generator 122 generates a plurality of voltages, using an external power voltage supplied to the memory device 100. The voltage generator 122 operates under the control of the control logic 125.

In an embodiment, the voltage generator 122 may generate an internal power voltage by regulating the external power voltage. The internal power voltage generated by the voltage generator 122 is used as an operating voltage of the memory device 100.

In an embodiment, the voltage generator 122 may generate a plurality of voltages, using the external power voltage or the internal power voltage.

For example, the voltage generator 122 may include a plurality of pumping capacitors for receiving the internal power voltage, and generate a plurality of voltages by selectively activating the plurality of pumping capacitors under the control of the control logic 130. The plurality of generated voltages are applied to word lines selected by the address decoder 121.

In a program operation, the voltage generator 122 may generate a high-voltage program pulse and a pass pulse lower than the program pulse. In a read operation, the voltage generator 122 may generate a read voltage and a pass voltage higher than the read voltage. In an erase operation, the voltage generator 122 may generate an erase voltage.

The read/write circuit 123 includes first to mth page buffers PB1 to PBm. The first to mth page buffers PB1 to PBm are coupled to the memory cell array 110 respectively through the first to mth bit lines BL1 to BLm. The first to mth page buffers PB1 to PBm operate under to control of the control logic 125.

The first to mth page buffers PB1 to PBm communicate data with the data input/output circuit 124. In a program operation, the first to mth page buffers PB1 to PBm receive data DATA to be stored through the data input/output circuit 124 and data lines DL.

In a program operation, when a program pulse is applied to a selected word line, the first to mth page buffers PB1 to PBm may transfer the data DATA received through the data input/out circuit 124 to selected memory cells through the bit lines BL1 to BLm. Memory cells of a selected page are programmed according to the transferred data DATA. A memory cell coupled to a bit line to which a program allow voltage (e.g., a ground voltage) is applied may have an increased threshold voltage. A threshold voltage of a memory cell coupled to a bit line to which a program inhibit voltage (e.g., a power voltage) may be maintained. In a program verify operation, the first to mth page buffers PB1 to PBm read page data from selected memory cells through the bit lines BL1 to BLm.

In a read operation, the read/write circuit 123 reads data DATA from memory cells of a selected page through the bit lines BL1 to BLm, and outputs the read data DATA to the data input/output circuit 124. In an erase operation, the read/write circuit 123 may float the bit lines BL1 to BLm.

In an embodiment, the read/write circuit 123 may include a column select circuit.

The data input/output circuit 124 is coupled to the first to mth page buffers PB1 to PBm through the data lines DL. The data input/output circuit 124 operates under the control of the control logic 125. In a program operation, the data input/output circuit 124 receives data DATA to be stored from an external controller (not shown).

The control logic 125 is coupled to the address decoder 121, the voltage generator 122, the read/write circuit 123, and the data input/output circuit 124. The control logic 125 may control overall operations of the memory device 100. The control logic 125 receives a command CMD and an address ADDR. The control logic 125 controls the address decoder 121, the voltage generator 122, the read/write circuit 123, and the data input/output circuit 124 in response to the command CMD.

The control logic 125 may include a bus precharge controller 127, a latch controller 128, and a delay time controller 129.

In this drawing, a bus may couple a plurality main latches and a plurality of cache latches. A structure of the plurality of main latches and the plurality of cache latches will be described with reference to FIGS. 3 and 8.

In an embodiment, any one of the plurality of main latches and a cache latch coupled to the corresponding main latch may constitute any one of the plurality of page buffers PB1 to PBm. In addition, the plurality of main latches and the plurality of cache latches may transmit or receive data through the bus.

In this drawing, the bus may be distinguished from a bus coupling components included in the memory controller 200 shown in FIG. 1. That is, the present disclosure is characterized in that the bus coupling the components of the memory device 100 is precharged.

Conventionally, when data was transmitted from a main latch to a cache latch or when data was transmitted from a cache latch to a main latch, the bus was precharged with the same voltage in the same period. However, although a distance difference existed between page buffers including main and cache latches, the bus was precharged with the same voltage in the same period, and therefore, the reliability of data was reduced.

However, in the present disclosure, a bus voltage level at which the bus is precharged and/or a time for which the bus is precharged is differently set for the respective page buffers, so that the reliability of data can be ensured.

The bus precharge controller 127 may precharge the bus. The bus precharge controller 127 may differently set a voltage level of the bus for the respective page buffers to precharge the bus. The cache latches and the main latches may be coupled to the bus. The cache latches and the main latches may be including in the page buffers, respectively.

In an embodiment, in order to apply a voltage corresponding to the voltage level of the bus, which is set for each page buffer, to the bus, the bus precharge controller 127 may generate a power voltage VCORE and a bus precharge signal PBUS_N such that the bus is precharged to a bus precharge voltage BP_VOL level. The bus precharge voltage BP_VOL level may be a voltage level to which the bus is precharged. The bus precharge signal PBUS_N may be a signal for turning on a bus precharge transistor coupled to the bus.

For example, in order to precharge the bus, the bus precharge controller 127 may generate a power voltage VCORE applied to the bus and a bus precharge signal PBUS_N. The bus precharge signal PBUS_N may be a signal for turning on the bus precharge transistor coupled to the bus. The bus precharge controller 127 may precharge the bus to the bus precharge voltage BP_VOL level by turning on the bus precharge transistor.

The latch controller 128 controls an operation after the bus is precharged. That is, the latch controller 128 controls an operation of transmitting data stored in a cache latch to the bus after the bus is precharged and an operation of storing the data transmitted to the bus in a main latch.

In an embodiment, in order to transmit data stored in a cache latch to the bus, the latch controller 128 may generate an evaluation signal TRANC. The evaluation signal TRANC may be a signal applied to a gate of an evaluation transistor coupled to the cache latch. The evaluation transistor may maintain a turn-on state while the evaluation signal TRANC is being applied.

In an embodiment, in order to store data transmitted through the bus in a main latch, the latch controller 128 may generate an acquisition signal TRANM. The acquisition signal TRANM may be a signal applied to a gate of an acquisition transistor coupled to the main latch. The acquisition transistor may maintain the turn-on state while the acquisition signal TRANM is being applied.

The delay time controller 129 may control a point of time when the evaluation signal TRANC is generated after the bus precharge signal PBUS_N is generated and a point of time when the bus precharge signal PBUSN is re-generated after the acquisition signal TRANM is generated.

For example, when the bus coupled to the cache latches and the main latches is precharged, the evaluation signal TRANC may be generated. The delay time controller 129 may control a time until the generation of the evaluation signal TRANC is started after the bus is precharged. That is, the delay time controller 129 may determine a time for which the generation of the evaluation signal TRANC is delayed. Subsequently, data stored in the main latches are all stored in the memory cell array, the delay time controller 129 may control a time until the generation of the bus precharge signal PBUS_N is started after the acquisition signal TRANM is generated. That is, the delay time controller 129 may determine a time for which the generation of the bus precharge signal PBUS_N is delayed.

Operations of the bus precharge controller 127, the latch controller 128, and the delay time controller 129, which are included in the control logic 125, will be described with reference to FIG. 4.

Figure 3:
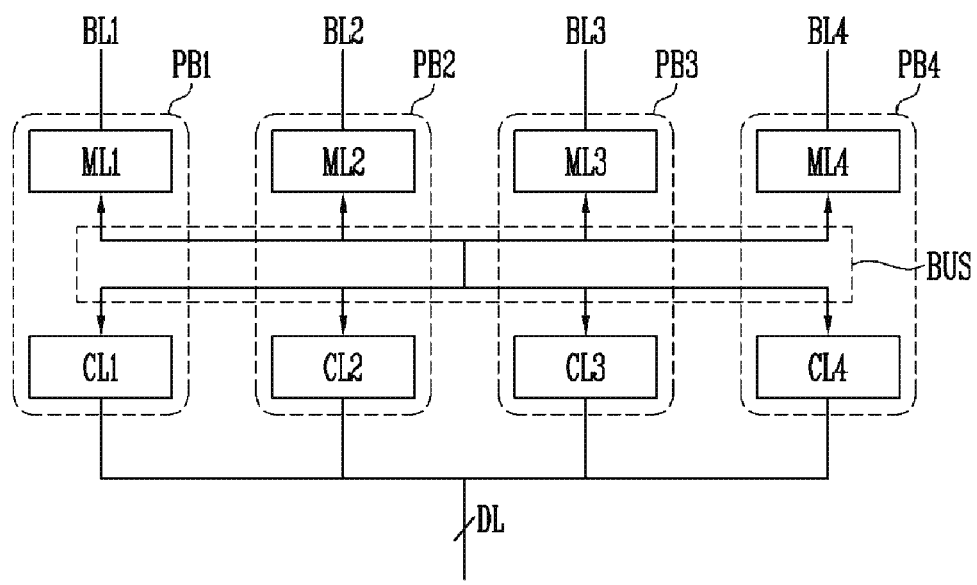
FIG. 3 is a diagram illustrating page buffers included in a read/write circuit shown in FIG. 2.

FIG. 3 is a diagram illustrating the page buffers included in the read/write circuit shown in FIG. 2.

Referring to FIGS. 2 and 3, FIG. 3 is a diagram illustrating some of the page buffers included in the read/write circuit shown in FIG. 2. The first page buffer PB1 may include a first main latch ML1 and a first cache latch CL1. The second page buffer PB2 may include a second main latch ML2 and a second cache latch CL2. The third page buffer PB3 may include a third main latch ML2 and a third cache latch CL3. The fourth page buffer PB4 may include a fourth main latch ML4 and a fourth cache latch CL4.

In an embodiment, the first main latch ML1 may be coupled to the first bit line BL1. The second main latch ML2 may be coupled to the second bit line BL2. The third main latch ML3 may be coupled to the third bit line BL3. The fourth main latch ML4 may be coupled to the fourth bit line BL4. The first to fourth main latches ML1 to ML4 may be coupled to the memory cell array shown in FIG. 2 through the first to fourth bit lines BL1 to BL4.

The first to fourth cache latches CL1 to CL4 may be coupled to the data lines DL. The first to fourth cache latches CL1 to CL4 may be coupled to the data input/output circuit shown in FIG. 2 through the data lines DL.

The first to fourth main latches ML1 to ML4 and the first to fourth cache latch CL1 to CL4 may be coupled through a bus BUS. For example, the first main latch ML1 may be coupled to the first cache latch CL1 through the bus BUS. The second main latch ML2 may be coupled to the second cache latch CL2 through the bus BUS. The third main latch ML3 may be coupled to the third cache latch CL3 through the bus BUS. The fourth main latch ML4 may be coupled to the fourth cache latch CL4 through the bus BUS.

In an embodiment, when the memory device performs a write operation, the memory device 100 may receive data from the memory controller 200. The data received from the memory controller 200 may be stored in the cache latches included the respective page buffers through the data input/output circuit. Data in a page unit may be stored in the cache latches.

For example, data in the page unit may be stored in the cache latches through the data lines coupled to the data input/output circuit. The data stored in the cache latches may be stored in the main latches through the bus BUS. The data stored in the main latches may be stored in the memory cell array through the bit lines.

In an embodiment, when data are stored in the cache latches, the bus BUS to which the cache latches and the main latches are coupled may be precharged. When the bus BUS is precharged, operations for storing the data stored in the cache latches in the main latches may be performed. An operation of turning on a transistor coupling a cache latch to the bus BUS and a transistor coupling a main latch to the bus BUS may be included in the operations for storing the data stored in the cache latches in the main latches.

Conventionally, data in the page unit, which were stored in the cache latches, were simultaneously stored in the main latches through the bus BUS. That is, when the data in the page unit were all stored in the cache latches, the data stored in the cache latches were stored in the main latches.

However, since points of time when data are stored in the cache latches through the data lines DL are different from each other, it may be necessary to differently set a voltage level of the precharged bus BUS, a time at which the transistor coupling the cache latch to the bus BUS is turned on, and a time at which the transistor coupling the main latch to the bus BUS is turned on.

That is, the first and second page buffers PB1 and PB2 will be described as an example. When the bus is precharged to transmit data of a cache latch included in the first and second page buffers PB1 and PB2 to a corresponding main latch, the control logic 125 shown in FIG. 2 may differently set the voltage level of the bus, based on positions of the first page buffer PB1 and the second page buffer PB2. Also, the control logic may generate an evaluation signal and an acquisition signal, which are used to transmit data stored in any one of the cache latches to any one of the main latches, based on the positions of the first page buffer PB1 and the second page buffer PB2.

Accordingly, in the present disclosure, there are proposed a method for differently setting the voltage level of the bus BUS when the bus BUS coupling the cache latches and the main latches is precharged, based on the positions of the first page buffer PB1 and the second page buffer PB2, and a method for turning on the transistor coupling the cache latch to the bus BUS is turned on, and a time at which the transistor coupling the main latch to the bus BUS is turned on.

For example, in the present disclosure, there is a method for generating a bus precharge signal PBUS_N such that, as a distance PBCL_LTH between a page buffer including a cache latch and a main latch and the control logic becomes shorter, a time for which the power voltage VCORE is applied is set shorter, when data is transmitted to the main latch from the cache latch in the page buffer.

In an embodiment, when a distance between the first page buffer PB1 and the control logic is relatively shorter than that between the second page buffer PB2 and the control logic, a bus precharge signal may be generated such that a time for which the power voltage VCORE is applied when data is transmitted to the first main latch ML1 from the first cache latch CL1 in the first page buffer PB1 is set relatively shorter than that for which the power voltage VCORE is applied when data is transmitted to the second main latch ML2 from the second cache latch CL2 in the second page buffer PB2.

In an embodiment, there is a proposed a method for setting a bus precharge voltage BP_VOL level at which the bus is precharged when data is transmitted to a main latch from a cache latch in a page buffer to become lower, as the distance PBCL_LTH between the page buffer including the cache latch and the main latch and the control logic becomes shorter.

In an embodiment, when a distance between the first page buffer PB1 and the control logic is relatively shorter than that between the second page buffer PB2 and the control logic, a bus precharge voltage BP_VOL applied to the bus when data is transmitted to the first main latch ML1 from the first cache latch CL1 in the first page buffer PB1 may be set relatively lower than that applied to the bus when data is transmitted to the second main latch ML2 from the second cache latch CL2 in the second page buffer PB2.

In an additional embodiment, when a distance between the first page buffer PB1 and the control logic is relatively shorter than that between the second page buffer PB2 and the control logic, an evaluation time that is a time for which the evaluation signal TRANC is applied to the gate of evaluation transistor may be set relatively shorter than that of the second page buffer PB2. Also, when a distance between the first page buffer PB1 and the control logic is relatively shorter than that between the second page buffer PB2 and the control logic, the control logic an acquisition time that is a time for which the acquisition signal TRANM is applied to the gate of the acquisition transistor, when data is transmitted to the first main latch ML1 from the first cache latch CL1 in the first page buffer PB1, is to be set relatively shorter than that of the second page buffer PB2.

In an embodiment, when the memory device 100 performs a read operation, the memory device 100 may store, in the page unit, data stored in the memory cell array in the main latches respectively included in the page buffers. The data stored in the main latches may be stored in the cache latches through the bus BUS. The data in the page unit, which are stored in the cache latches, may be transmitted to the memory controller 200 via the data input/output circuit through the data lines DL.

In an embodiment, when data are stored in the main latches, the bus BUS to which the cache latches and the main latches are coupled may be precharged. When the bus BUS is precharged, operations for storing the data stored in the main latches in the cache latches may be performed. An operation of turning on a transistor coupling a cache latch to the bus BUS and a transistor coupling a main latch to the bus BUS may be included in the operations for storing the data stored in the main latches in the cache latches.

Conventionally, when data in the page unit were all stored in the main latches, the data stored in the main latches were transmitted to the cache latches. However, since points of time when data are stored in the main latches through are different from each other, it is necessary to differently set a voltage level of the precharged bus BUS, a time at which the transistor coupling the cache latch to the bus BUS is turned on, and a time at which the transistor coupling the main latch to the bus BUS is turned on.

Like the write operation, in the read operation, the voltage level of the bus BUS may be differently set when the bus BUS coupling the cache latches and the main latches is precharged based on the positions of the page buffers, and the points of time when the transistor coupling the cache latch to the bus BUS and the transistor coupling the main latch to the bus BUS are turned on may be controlled.

Figure 4:
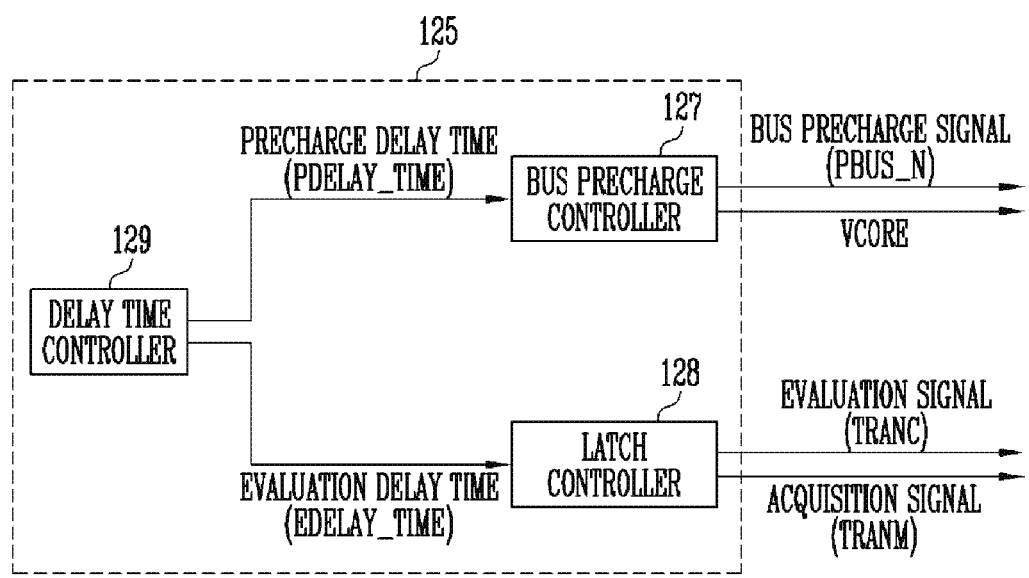
FIG. 4 is a block diagram illustrating a structure of a control logic shown in FIG. 2.

FIG. 4 is a block diagram illustrating a structure of the control logic shown in FIG. 2.

Referring to FIG. 4, the control logic 125 may include a bus precharge controller 127, a latch controller 128, and a delay time controller 129. The bus precharge controller 127 may control the bus coupled to the cache latches and the main latches to be precharged. The latch controller 128 may generate signals for storing data stored in a cache latch into a main latch. The delay time controller 129 may control a delay time of the signals for storing the data stored in the cache latch into the main latch.

In an embodiment, the delay time controller 129 may control a precharge delay time PDELAY_TIME and an evaluation delay time EDELAY_TIME. That is, the delay time controller 129 may determine the precharge delay time PDELAY_TIME and the evaluation delay time EDELAY_TIME. The precharge delay time PDELAY_TIME may be a time from a point of time when the generation of an acquisition signal TRANM is ended to a point of time when the generation of a bus precharge signal PBUS_N is started. The evaluation delay time EDELAY_TIME may be a time from a point of time when the generation of the bus precharge signal PBUS_N is ended to a point of time when the generation of an evaluation signal TRANC is started.

For example, the delay time controller 129 may determine an evaluation delay time EDELAY_TIME. The evaluation delay time EDELAY_TIME may be a time for which the generation of an evaluation signal for turning on an evaluation transistor coupled to a cache latch is delayed.

The evaluation delay time EDELAY_TIME may be determined according to a distance PBCL_LTH between a page buffer including a cache latch determined to transmit or store data and the control logic. The evaluation delay time EDELAY_TIME may be set longer, as the distance PBCL_LTH between the page buffer including the cache latch determined to transmit or store data and the control logic becomes more distant. When the evaluation delay time EDELAY_TIME elapses, the latch controller 128 may generate an evaluation signal TRANC for transmitting the data stored in the cache latch to the bus.

In an embodiment, the delay time controller 129 may determine a precharge delay time PDELAY_TIME. The precharge delay time PDELAY_TIME may be a time for which the generation of a bus precharge signal PBUS_N for turning on a bus precharge transistor is delayed.

The precharge delay time PDELAY_TIME may be determined according to a distance PBCL_LH between a page buffer including a cache latch determined to transmit data and the control logic. The precharge delay time PDELAY_TIME may be set longer, as the distance PBCL_LH between the page buffer including the cache latch determined to transmit data and the control logic becomes more distant. When the precharge delay time PDELAY_TIME elapses, the bus precharge controller 127 may generate a bus precharge signal PBUS_N for turning on a bus precharge transistor.

In an embodiment, the delay time controller 129 may provide the determined precharge delay time PDELAY_TIME to the bus precharge controller 127. The bus precharge controller 127 may generate a bus precharge signal PBUS_N and a power voltage VCORE, based on the precharge delay time PDELAY_TIME.

Also, the delay time controller 129 may provide the determined evaluation delay time EDELAY_TIME to the latch controller 128. The latch controller 128 may generate an evaluation signal TRANC and an acquisition signal TRANM, based on the evaluation delay time EDELAY_TIME.

Figure 5:
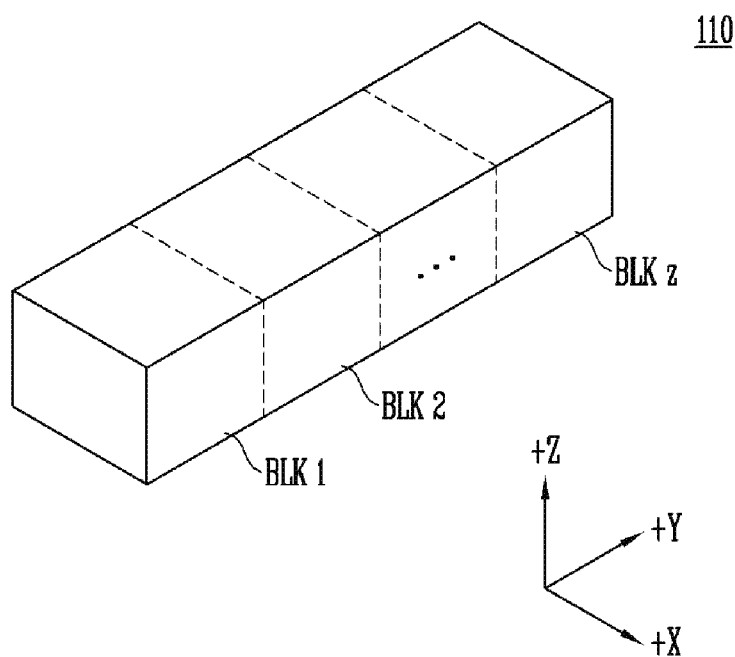
FIG. 5 is a diagram illustrating an embodiment of a memory cell array shown in FIG. 2.

FIG. 5 is a diagram illustrating an embodiment of the memory cell array shown in FIG. 2.

Referring to FIG. 5, the memory cell array 110 may include a plurality of memory blocks BLK1 to BLKz. Each memory block may have a three-dimensional structure. Each memory block may include a plurality of memory cells stacked on a substrate (not shown). The plurality of memory cells may be arranged along +X, +Y, and +Z directions. A structure of each memory block will be described in more detail with reference to FIGS. 6 and 7.

Figure 6:
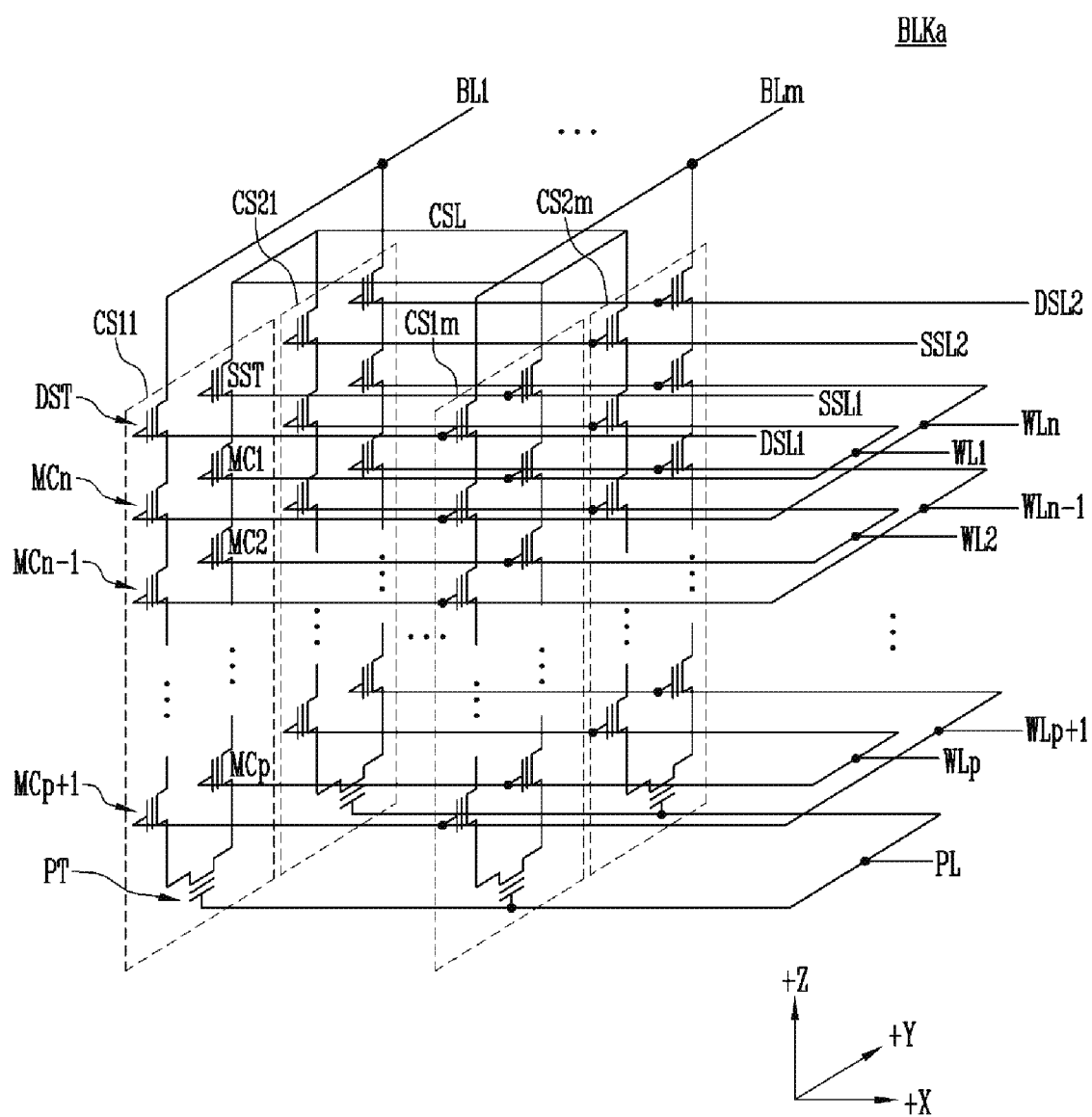
FIG. 6 is a circuit diagram illustrating any one memory block among memory blocks shown in FIG. 5.

FIG. 6 is a circuit diagram illustrating any one memory block BLKa among the memory blocks BLK1 to BLKz shown in FIG. 5.

Referring to FIG. 6, the memory block BLKa may include a plurality of cell strings CS11 to CS1*m* and CS21 to CS2*m*. In an embodiment, each of the plurality of cell strings CS11 to CS1*m* and CS21 to CS2*m* may be formed in a 'U' shape. In the memory block BLKa, m cell strings are arranged in a row direction (i.e., a +X direction). FIG. 6 illustrates two cell strings arranged in a column direction (i.e., a +Y direction). However, this is for convenience of description, and it will be understood that three cell strings may be arranged in the column direction.

Each of the plurality of cell strings CS11 to CS1*m* and CS21 to CS2*m* may include at least one source select transistor SST, first to nth memory cells MC1 to MCn, a pipe transistor PT, and at least one drain select transistor DST.

The select transistors SST and DST and the memory cells MC1 to MCn may have structures similar to one another. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between a common source line CSL and memory cells MC1 to MCp.

In an embodiment, the source select transistors of cell strings arranged on the same row are coupled to a source select line extending in the row direction, and the source select transistors of cell strings arranged on different rows are coupled to different source select lines. In FIG. 6, the source select transistors of the cell strings CS11 to CS1*m* on a first row are coupled to a first source select line SSL1. The source select transistors of the cell strings CS21 to CS2*m* on a second row are coupled to a second source select line SSL2.

In another embodiment, the source select transistors of the cell strings CS11 to CS1*m* and CS21 to CS2*m* may be commonly coupled to one source select line.

The first to nth memory cells MC1 to MCn of each cell string are coupled between the source select transistor SST and the drain select transistor DST.

The first to nth memory cells MC1 to MCn may be divided into first to pth memory cells MC1 to MCp and a (p+1)th to nth memory cells MCp+1 to MCn. The first to pth memory cells MC1 to MCp are sequentially arranged in the opposite direction of a +Z direction, and are coupled in series between the source select transistor SST and the pipe transistor PT. The (p+1)th to nth memory cells MCp+1 to MCn are sequentially arranged in the +Z direction, and are coupled in series between the pipe transistor PT and the drain select transistor DST. The first to pth memory cells MC1 to MCp and the (p+1)th to nth memory cells MCp+1 to MCn are coupled through the pipe transistor PT. Gate electrodes of the first to nth memory cells MC1 to MCn of each cell string are coupled to first to nth word lines WL1 to WLn, respectively.

A gate of the pipe transistor PT of each cell string is coupled to a pipe line PL.

The drain select transistor DST of each cell string is coupled between a corresponding bit line and the memory cells MCp+1 to MCn. Cell strings arranged in the row direction are coupled to a drain select line extending in the row direction. The drain select transistors of the cell strings CS11 to CS1*m* on the first row are coupled to a first drain select line DSL1. The drain select transistors of the cell strings CS21 to CS2*m* on the second row are coupled to a second drain select line DSL2.

Cell strings arranged in the column direction are coupled to a bit line extending in the column direction. In FIG. 6, the cell strings CS11 and CS21 on a first column are coupled to a first bit line BL1. The cell strings CS1*m* and CS2*m* on an mth column are coupled to an mth bit line BLm.

Memory cells coupled to the same word line in the cell strings arranged in the row direction constitute one page. For example, memory cells coupled to the first word line WL1 in the cell strings CS11 to CS1*m* on the first row constitute one page. Memory cells coupled to the first word line WL1 in the cell strings CS21 to CS2*m* on the second row constitute another page. As any one of the drain select lines DSL1 and DSL2 is selected, cell strings arranged in one row direction may be selected. As any one of the word lines WL1 to WLn is selected, one page may be selected in the selected cell strings.

In another embodiment, even bit lines and odd bit lines may be provided instead of the first to mth bit lines BL1 to BLm. In addition, even-numbered cell strings among the cell strings CS11 to CS1*m* or CS21 to CS2*m* arranged in the row direction may be coupled to the even bit lines, respectively, and odd-numbered cell strings among the cell strings CS11 to CS1*m* or CS21 to CS2*m* arranged in the row direction may be coupled to the odd bit lines, respectively.

In an embodiment, at least one of the first to nth memory cells MC1 to MCn may be used as a dummy memory cell. For example, the at least one dummy memory cell may be provided to decrease an electric field between the source select transistor SST and the memory cells MC1 to MCp. Alternatively, the at least one dummy memory cell may be provided to decrease an electric field between the drain select transistor DST and the memory cells MCp+1 to MCn. When the number of dummy memory cells increases, the reliability of an operation of the memory block BLKa is improved. On the other hand, the size of the memory block BLKa increases. When the number of dummy memory cells decreases, the size of the memory block BLKa decreases. On the other hand, the reliability of an operation of the memory block BLKa may be deteriorated.

In order to efficiently control the at least one dummy memory cell, the dummy memory cells may have a required threshold voltage. Before or after an erase operation of the memory block BLKa, a program operation may be performed on all or some of the dummy memory cells. When an erase operation is performed after the program operation is performed, the threshold voltage of the dummy memory cells control a voltage applied to the dummy word lines coupled to the respective dummy memory cells, so that the dummy memory cells can have the required threshold voltage.

The present disclosure may be applied even in the above-described memory block having a three-dimensional structure. That is, a main latch may be coupled to each of the first to mth bit lines BL1 to BLm. The main latch may be coupled to a cache latch through a bus. A time and/or a precharge level, at which the bus for coupling the main latch and the cache latch is precharged, according to a position of a page buffer including the main latch and the cache latch.

Figure 7:
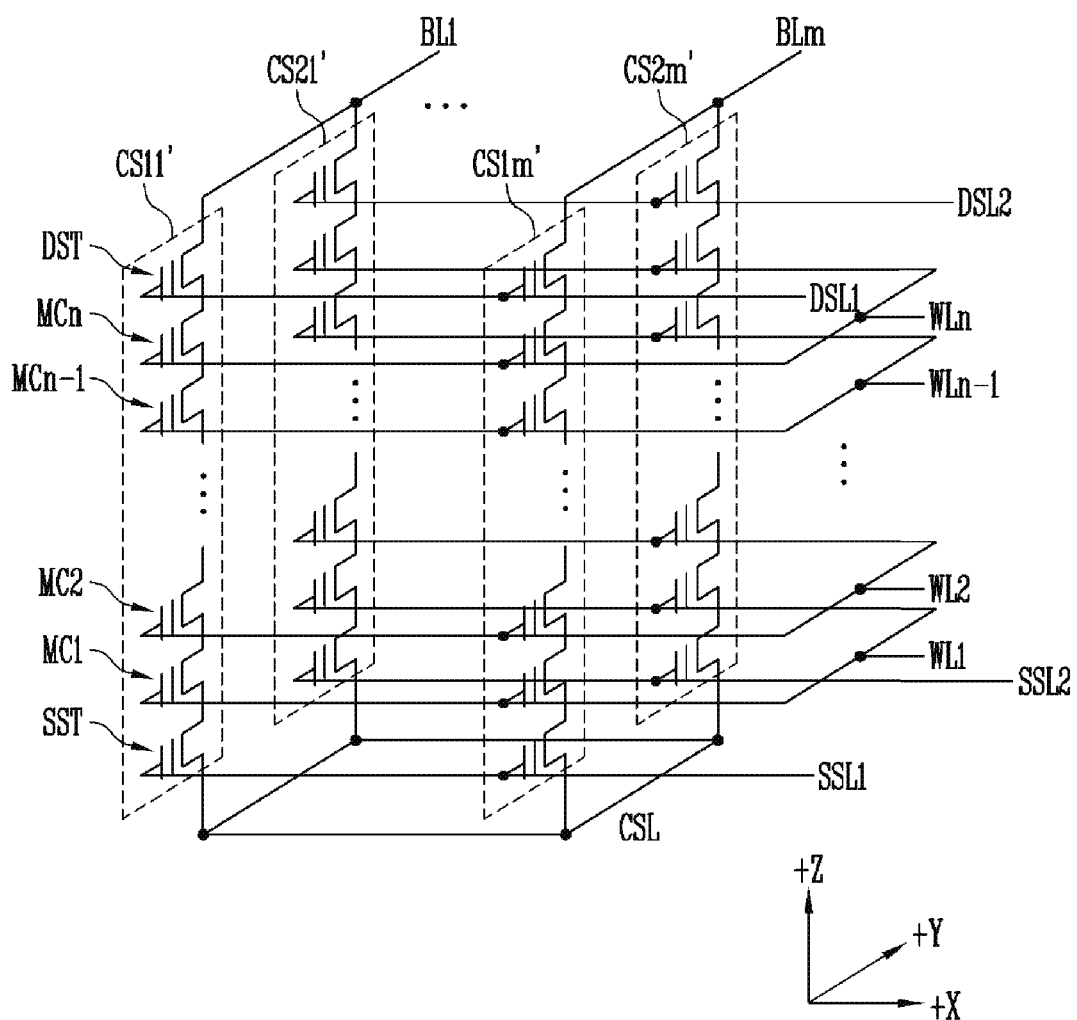
FIG. 7 is a circuit diagram illustrating another embodiment of the one memory block among the memory blocks shown in FIG. 5.

FIG. 7 is a circuit diagram illustrating another embodiment BLKb of the one memory block among the memory blocks BLK1 to BLKz shown in FIG. 5.

Referring to FIG. 7, the memory block BLKb may include a plurality of cell strings CS11' to CS1m' and CS21' to CS2m'. Each of the plurality of cell strings CS11' to CS1m' and CS21' to CS2m' extends along the +Z direction. Each of the plurality of cell strings CS11' to CS1m' and CS21' to CS2m' includes at least one source select transistor SST, first to nth memory cells MC1 to MCn, and at least one drain select transistor DST, which are stacked on a substrate (not shown) under the memory block BLKb.

The source select transistor SST of each cell string is coupled between a common source line CSL and the memory cells MC1 to MCn. The source select transistors of cell strings arranged on the same row are coupled to the same source select line. The source select transistors of the cell strings CS11' to CS1m' arranged on a first row are coupled to a first source select line SSL1. Source select transistors of the cell strings CS21' to CS2m' arranged on a second row are coupled to a second source select line CSL2. In another embodiment, the source select transistors of the cell strings CS11' to CS1m' and CS21' to CS2m' may be commonly coupled to one source select line.

The first to nth memory cells MC1 to MCn of each cell string are coupled in series between the source select transistor SST and the drain select transistor DST. Gate electrodes of the first to nth memory cells MC1 to MCn are coupled to first to nth word lines WL1 to WLn, respectively.

The drain select transistor DST of each cell string is coupled between a corresponding bit line and the memory cells MC1 to MCn. The drain select transistors of cell strings arranged in the row direction are coupled to a drain select line extending in the row direction. The drain select transistors of the cell strings CS11' to CS1m' on the first row are coupled to a first drain select line DSL1. The drain select transistors of the cell strings CS21' to CS2m' on the second row are coupled to a second drain select line DSL2.

Consequently, the memory block BLKb of FIG. 7 has a circuit similar to that of the memory block BLKa of FIG. 6, except that the pipe transistor PT is excluded from each cell string in FIG. 7.

In another embodiment, even bit lines and odd bit lines may be provided instead of the first to mth bit lines BL1 to BLm. In addition, even-numbered cell strings among the cell strings CS11' to CS1m' or CS21' to CS2m' arranged in the row direction may be coupled to the even bit lines, respectively, and odd-numbered cell strings among the cell strings CS11' to CS1m' or CS21' to CS2m' arranged in the row direction may be coupled to the odd bit lines, respectively.

In an embodiment, at least one of the first to nth memory cells MC1 to MCn may be used as a dummy memory cell. For example, the at least one dummy memory cell may be provided to decrease an electric field between the source select transistor SST and the memory cells MC1 to MCp. Alternatively, the at least one dummy memory cell may be provided to decrease an electric field between the drain select transistor DST and the memory cells MCp+1 to MCn. When the number of dummy memory cells increases, the reliability of an operation of the memory block BLKb is improved. On the other hand, the size of the memory block BLKb is increased. When the number of dummy memory cells decreases, the size of the memory block BLKb decreases. On the other hand, the reliability of an operation of the memory block BLKb may be deteriorated.

In order to efficiently control the at least one dummy memory cell, the dummy memory cells may have a required threshold voltage. Before or after an erase operation of the memory block BLKb, a program operation may be performed on all or some of the dummy memory cells. When an erase operation is performed after the program operation is performed, the threshold voltage of the dummy memory cells control a voltage applied to the dummy word lines coupled to the respective dummy memory cells, so that the dummy memory cells can have the required threshold voltage.

The present disclosure may be applied even in the above-described memory block having a three-dimensional structure. That is, a main latch may be coupled to each of the first to mth bit lines BL1 to BLm. The main latch may be coupled to a cache latch through a bus. A time and/or a precharge level, at which the bus for coupling the main latch and the cache latch is precharged, according to a position of a page buffer including the main latch and the cache latch.

Figure 8:
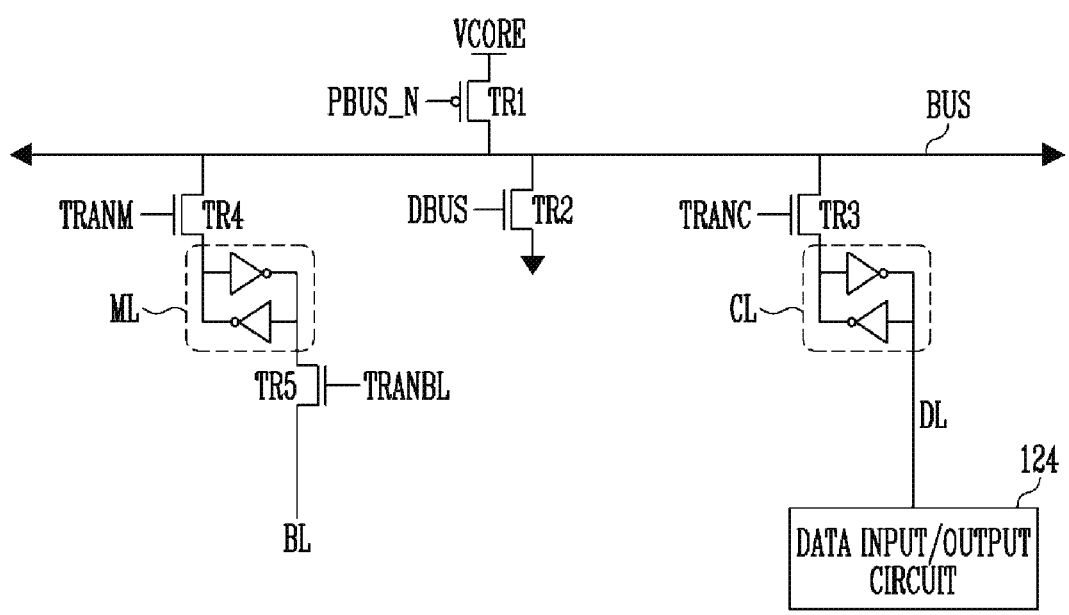
FIG. 8 is a diagram illustrating transmission of data through a bus.

FIG. 8 is a diagram illustrating transmission of data through the bus.

Referring to FIGS. 3 and 8, FIG. 8 illustrates any one of the page buffers shown in FIG. 3. The page buffer coupled to the bus BUS may include one cache latch CL and one main latch ML.

In an embodiment, first and second transistors TR1 and TR2 may be coupled to the bus BUS. The first transistor TR1 may be a bus precharge transistor coupling a power voltage VCORE to the bus BUS. The second transistor TR2 may be a bus discharge transistor coupling a ground terminal to the bus BUS. The first transistor TR1 may be implemented with a PMOS transistor, and the second transistor TR2 may be implemented with an NMOS transistor.

A third transistor TR3 may be coupled between the bus BUS and the cache latch CL. The third transistor TR3 may be an evaluation transistor. The third transistor TR3 may be implemented with an NMOS transistor. The cache latch CL may be coupled to the data input/output circuit 124 through data lines DL.

A fourth transistor TR4 may be coupled between the bus BUS and the main latch ML. The fourth transistor TR4 may be an acquisition transistor. The fourth transistor TR4 may be implemented with an NMOS transistor.

A fifth transistor TR5 may be coupled between the main latch ML and a bit line BL. The fifth transistor TR5 may be a bit line select transistor. The fifth transistor TR5 may be implemented with an NMOS transistor.

In an embodiment, in a write operation, data received from the memory controller 200 may be stored in the cache latch CL through the data input/output circuit 124 and the data lines DL. When the data is stored in the cache latch CL, the bus BUS may be precharged. The bus BUS may be precharged to store the data stored in the cache latch CL in the memory cell array through the main latch ML.

In an embodiment, in a read operation, data stored in the memory cell array may be stored in the main latch ML through the bit line BL. When the data is stored in the main latch ML, the bus BUS may be precharged. The bus BUS may be precharged to transmit the data stored in the main latch ML to the data input/output circuit 124 through the cache latch CL.

When the bus BUS is precharged, the bus precharge controller 127 may set a voltage level of the precharged bus BUS. The voltage level of the bus BUS may be set based on a distance PBCL_LTH between a page buffer including a cache latch CL determined to transmit data and the control logic. For example, the voltage level of the bus BUS may be set lower, as the distance PBCL_LTH between the page buffer and the control logic becomes shorter. The bus precharge controller 127 may set a time for which the power voltage VCORE is applied to be short or set the power voltage VCORE to be lower to set the voltage level of the bus BUS to be low.

In an embodiment, a bus precharge signal PBUS_N may be applied to a gate of the first transistor TR1 to precharge the bus BUS. When the bus precharge signal PBUS_N is applied to the gate of the first transistor TR1, the first transistor TR1 may be turned on. When the first transistor TR1 is turned on, the bus BUS may be precharged. The bus precharge controller 127 may control a bus precharge time BP_TIME that is a time for which the bus precharge signal PBUS_N is applied to the gate of the first transistor TR1. Also, the bus precharge controller 127 may generate a power voltage VCORE that is a voltage applied to the bus BUS.

In order to discharge the bus BUS after the bus BUS is precharged, a bus discharge signal DBUS may be applied to a gate of the second transistor TR2. When the bus discharge signal DBUS is applied to the gate of the second transistor TR2, the second transistor TR2 may be turned on. When the second transistor TR2 is turned on, the bus BUS may be discharged.

In an embodiment, in a write operation, an evaluation signal TRANC may be applied to a gate of the third transistor TR3 such that data stored in the cache latch CL is transmitted to the bus BUS, when the bus BUS is precharged. When the evaluation signal TRANC is applied to the gate of the third transistor TR3, the third transistor TR3 may be turned on. When the third transistor TR3 is turned on, the data stored in the cache latch CL may be transmitted to the bus BUS.

When the data stored in the cache latch CL is transmitted to the bus BUS, an acquisition signal TRANM may be applied to a gate of the fourth transistor TR4 such that the data transmitted to the bus BUS is stored in the main latch ML. When the acquisition signal TRANM is applied to the gate of the fourth transistor TR4, the fourth transistor TR4 may be turned on. When the fourth transistor TR4 is turned on, the data transmitted to the bus BUS may be stored in the main latch ML.

In order to store the data stored in the main latch ML in the memory cell array, a bit line select signal TRANBL may be applied to a gate of the fifth transistor TR5. When the bit line select signal TRANBL is applied to the gate of the fifth transistor TR5, the fifth transistor TR5 may be turned on. When the fifth transistor TR5 is turned on, the data stored in the main latch ML may be stored in the memory cell array through the bit line BL.

The latch controller 128 may control an evaluation time EVAL_TIME that is a time for which the evaluation signal TRANC is applied to the gate of the third transistor TR3 and an acquisition time CTH_TIME that is a time for which the acquisition signal TRANM is applied to the gate of the fourth transistor TR4. For example, when a distance PBCL_LTH between the page buffer including the cache latch CL and the main latch ML and the control logic is relatively shorter than that between another page buffer and the control logic, the evaluation time EVAL_TIME and the acquisition time CTH_TIME may be set relatively short.

That is, when data is transmitted to the main latch ML from the cache latch CL in the page buffer, the latch controller 128 may set the evaluation time EVAL_TIME to be shorter, as the distance between the page buffer and the control logic becomes shorter. Also, when data is transmitted to the main latch ML from the cache latch CL in the page buffer, the latch controller 128 may set the acquisition time CTH_TIME to be shorter, as the distance between the page buffer and the control logic becomes shorter.

In another embodiment, in a read operation, an acquisition signal TRANM may be applied to the gate of the fourth transistor TR4 such that data stored in the main latch ML is transmitted to the bus BUS through the bit line BL, when the bus BUS is precharged. When the acquisition signal TRANM is applied to the gate of the fourth transistor TR4, the fourth transistor TR4 may be turned on. When the fourth transistor TR4 is turned on, the data stored in the main latch ML may be transmitted to the bus BUS.

When the data stored in the main latch ML is transmitted to the bus BUS, an evaluation signal TRANC may be applied to the gate of the third transistor TR3 such that the data transmitted to the bus BUS is stored in the cache latch CL. When the evaluation signal TRANC is applied to the gate of the third transistor TR3, the third transistor TR3 may be turned on. When the third transistor TR3 is turned on, the data transmitted to the bus BUS may be stored in the cache latch CL. The data stored in the cache latch CL may be provided to the data input/output circuit 124 through the data lines DL. The data input/output circuit 124 may receive the data and the received data to the memory controller 200.

When data is transmitted to the cache latch CL from the main latch ML in the page buffer, the latch controller 128 may set the acquisition time CTH_TIME to become shorter, as the distance PBCL_LTH between the page buffer and the control logic becomes shorter. Also, when data is transmitted to the cache latch CL from the main latch ML in the page buffer, the latch controller 128 may set the evaluation time EVAL_TIME to become shorter, as the distance PBCL_LTH between the page buffer and the control logic becomes shorter.

In another embodiment, a plurality of main latches may correspond to one cache latch. That is, one cache latch and a plurality of main latches may be included in one page buffer. Therefore, data stored in the cache latch may be stored in any one of the plurality of main latches. That is, a main latch in which the data stored in the cache latch is stored may be selected.

Figure 9:
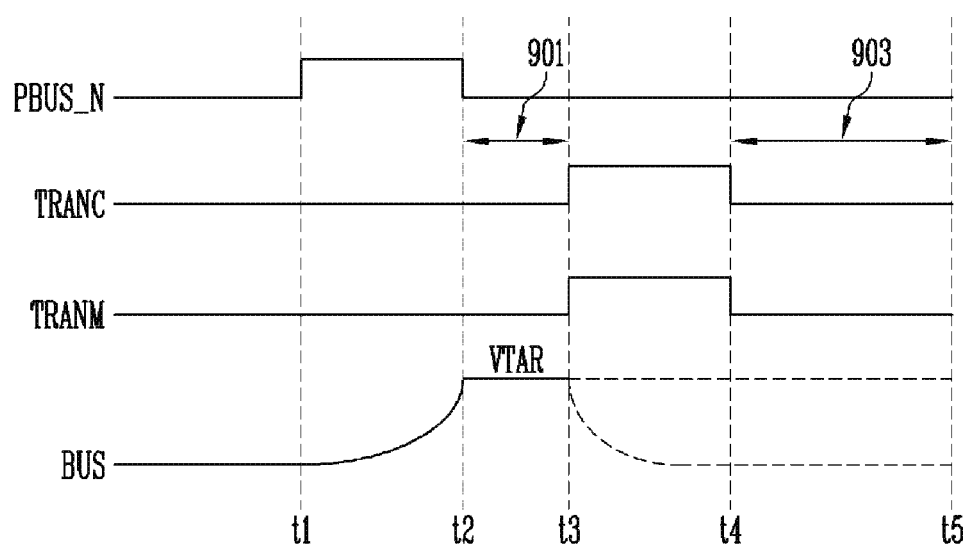
FIG. 9 is a diagram illustrating a signal generated in data transmission through the bus and a change in voltage of the bus.

FIG. 9 is a diagram illustrating a signal generated in data transmission through the bus and a change in voltage of the bus.

Referring to FIG. 9, signals shown in FIG. 9 represent a bus precharge signal PBUS_N applied to the gate of the bus precharge transistor, an evaluation signal TRANC applied to the gate of the evaluation transistor, an acquisition signal TRANM applied to the gate of the acquisition transistor, and a change in voltage of the bus. Referring to FIGS. 8 and 9, the first transistor TR1 may be an embodiment of the bus precharge transistor, the third transistor TR3 may be an embodiment of the evaluation transistor, and the fourth transistor TR4 may be an embodiment of the acquisition transistor.

FIG. 9 illustrates signals generated when data is transmitted to a main latch included in any one page buffer among the plurality of page buffers from a cache latch included in the one page buffer or when data is transmitted to a cache latch from the main latch in the one page buffer.

Therefore, FIG. 9 illustrates signals generated when data in the page unit is transmitted from the page buffer to the memory cell array or when data in the page unit is transmitted from the page buffer to the data input/output circuit.

At t1 to t2, a bus precharge signal PBUS_N may be generated. The generated bus precharge signal PBUS_N may be applied to the gate of the bus precharge transistor.

In an embodiment, when data is stored in the cache latch in a write operation of the memory device 100, a bus precharge signal PBUS_N may be generated. In another embodiment, when data is stored in the main latch in a read operation of the memory device 100, the bus precharge signal may be generated. Consequently, t1 may be a point of time when data is stored in the cache latch or a point of time when data is stored in the main latch.

At t1 to t2, the voltage of the bus may be increased according to time. When the bus precharge transistor is turned on since the bus precharge signal PBUS_N is generated, the voltage of the bus may be increased. A power voltage VCORE applied to the bus may be a bus precharge voltage BP_VOL. At t1 to t2, when the bus is precharged, the voltage of the bus may reach a target voltage VTAR.

A time 901 of t2 to t3 may be an evaluation delay time EDELAY_TIME. The evaluation delay time EDELAY_TIME may be a time from a point of time when the precharge of the bus is ended to a point of time when the transmission of data stored in any one of the cache latches through the bus is started or to a point of time when the transmission of data stored in any one of the main latches. The evaluation delay time EDELAY_TIME may be controlled by the delay time controller 129. After the evaluation delay time (t2 to t3) elapses, the latch controller 128 may generate an evaluation signal TRANC and an acquisition signal TRANM.

The delay time controller 129 may set the evaluation delay time EDELAY_TIME according to a distance PBCL_LTH between a page buffer including a cache latch or main latch where the transmission of data or the storage of data is determined and the control logic. The evaluation delay time EDELAY_TIME may be set shorter, as the distance PBCL_LTH between the page buffer and the control logic becomes shorter.

At t2 to t3, the bus precharge signal PBUS_N, the evaluation signal TRANC, and the acquisition signal TRANM may not be generated. That is, at t2 to t3 as the evaluation delay time EDELAY_TIME, the voltage of the bus may be maintained as the target voltage.

At t3 to t4, an evaluation signal TRANC and an acquisition signal TRANM may be generated. The evaluation signal TRANC may be a signal applied to the gate of the evaluation transistor, and the acquisition signal TRANM may be a signal applied to the gate of the acquisition transistor.

Although a case where the evaluation signal TRANC and the acquisition signal TRANM are generated at interval t3 to t4 is illustrated in FIG. 9, the evaluation signal TRANC and the acquisition signal TRANM may be generated with a time difference. That is, the acquisition signal TRANM may be generated after a certain time elapses after the generation of the evaluation signal TRANC is started. Alternatively, the evaluation signal TRANC may be generated after a certain time elapses after the generation of the acquisition signal TRANM is started.

In an embodiment, in a write operation, when the evaluation signal TRANC is generated at t3 to t4, the evaluation transistor is turned on. When the evaluation transistor is turned on, data stored in the cache latch may be transmitted to the bus. Also, when the acquisition transistor TRANM is turned on since the acquisition time TRANM is generated at t3 to t4, the data transmitted to the bus may be stored in the main latch.

In an embodiment, in a read operation, when the acquisition signal TRANM is generated at t3 to t4, the acquisition transistor is turned on. When the acquisition transistor is turned on, data stored in the main latch may be transmitted to the bus. Also, when the evaluation transistor is turned on since the evaluation signal TRANC is generated at t3 to t4, the data transmitted to the bus may be stored in the cache latch.

At t3 to t4, the voltage of the bus may be maintained as the target voltage or be decreased to 0 V from the target voltage. In an embodiment, when the data stored in the cache latch or the main latch is "0," the voltage of the bus may be decreased to 0 V from the target voltage. That is, when the data stored in the cache latch or the main latch is "0," the voltage of the bus may be decreased in the data transmission process. In another embodiment, when the data stored in the cache latch or the main latch is "1," the voltage of the bus may be maintained as the target voltage. That is, when the data stored in the cache latch or the main latch is "1," the voltage of the bus is not decreased but may be maintained in the data transmission process.

A time 903 of t4 to t5 may be a precharge delay time PDELAY_TIME. The precharge delay time PDELAY_TIME may be a time up to a point of time when the precharge of the bus is re-started after data stored in any one of the main latches is stored in the memory cell array. Alternatively, the precharge delay time PDELAY_TIME may be a time up to a point of time the precharge of the bus is re-started after data stored in any one of the cache latches is transmitted to the data input/output circuit. During the precharge delay time PDELAY_TIME, the evaluation signal TRANC and the acquisition signal TRANM may not be generated. The precharge delay time PDELAY_TIME may be controlled by the delay time controller 129.

The delay time controller 129 may set a precharge delay time PDELAY_TIME according to a distance PBCL_LTH between a page buffer including a cache latch or main latch where the transmission of data or the storage of data is determined and the control logic. The precharge delay time PDELAY_TIME may be set shorter, as the distance PBCL_LTH between the page buffer and the control logic becomes shorter.

The bus precharge controller 127 may generate a bus precharge signal PBUS_N, after the precharge delay time PDELAY_TIME elapses.

After t5, the operation performed at t1 to t5 may be repeatedly performed, until data in the page unit, which are stored in the cache latches, are all transmitted to the main latches or until data in the page unit, which are stored in the main latches, are all transmitted to the cache latches.

FIGS. 10A and 10B are diagrams illustrating a bus precharge voltage and a bus precharge time.

Referring to FIGS. 10A and 10B, FIG. 10A illustrates bus precharge voltage BP_VOL according to distance PBCL_LTH between the page buffer and the control logic, and FIG. 10B illustrates bus precharge time BP_TIME according to distance PBCL_LTH between the page buffer and the control logic. The bus precharge voltage BP_VOL may be a voltage level precharged so as to transmit data stored in the cache latch to the main latch or to transmit data stored in the main latch to the cache latch.

Referring to FIG. 10A, a first column of FIG. 10A represents distance PBCL_LTH between the page buffer and the control logic, and a second column of FIG. 10A represents bus precharge voltage BP_VOL corresponding to the distance PBCL_LTH between the page buffer and the control logic. That is, the bus precharge voltage BP_VOL may be determined according to a position of the page buffer.

In an embodiment, a voltage corresponding to a first distance PBCL_LTH1 of the first column may be a first bus precharge voltage BP_VOL1, a voltage corresponding to a second distance PBCL_LTH2 of the first column may be a second bus precharge voltage BP_VOL2, a voltage corresponding to a third distance PBCL_LTH3 of the first column may be a third bus precharge voltage BP_VOL3, and a voltage corresponding to a fourth distance PBCL_LTH4 of the first column may be a fourth bus precharge voltage BP_VOL4.

A number of distances PBCL_LTH between page buffers and the control logic, which are included in the first column of FIG. 10A may be smaller than or equal to that of page buffers included in the read/write circuit. That is, page buffers having the same distance PBCL_LTH from the control logic may exist.

Distances PBCL_LTH between the page buffers and the control logic may be different from or equal to each other. In bus precharge, when distances PBCL_LTH between the page buffers and the control logic are different from each other, the bus precharge controller 127 may generate a power voltage such that the bus is precharged to bus precharge voltage BP_VOL levels having different magnitudes. When distances PBCL_LTH between the page buffers and the control logic are equal to each other, the bus precharge controller 127 may precharge the bus to a bus precharge voltage BP_VOL having the same magnitude.

When a distance between any one page buffer of the first column of FIG. 10A and the control logic is relatively shorter than that between another page buffer and the control logic, a bus precharge voltage BP_VOL set for each page buffer may be relatively low, when data is transmitted from the cache latch to the main latch or when data is transmitted from the main latch to the cache latch. On the contrary, when a distance PBCL_LTH between any one page buffer and the control logic is relatively longer than that between another page buffer and the control logic, a bus precharge voltage BP_VOL set for each page buffer may be relatively high, when data is transmitted from the cache latch to the main latch or when data is transmitted from the main latch to the cache latch.

Referring to FIG. 10B, a first column of FIG. 10B represents distance PBCL_LTH between the page buffer and the control logic, and a second column of FIG. 10B represents bus precharge time BP_TIME corresponding to the distance PBCL_LTH between the page buffer and the control logic. That is, the bus precharge time BP_TIME may be determined according to a position of the page buffer.

In an embodiment, a time corresponding a first distance PBCL_LTH1 of the first column may be a first bus precharge time BP_TIME1, a time corresponding a second distance PBCL_LTH2 of the first column may be a second bus precharge time BP_TIME2, a time corresponding a third distance PBCL_LTH3 of the first column may be a third bus precharge time BP_TIME3, and a time corresponding a fourth distance PBCL_LTH4 of the first column may be a fourth bus precharge time BP_TIME4.

A number of distances PBCL_LTH between page buffers and the control logic, which are included in the first column of FIG. 10B may be smaller than or equal to that of page buffers included in the read/write circuit. That is, page buffers having the same distance PBCL_LTH from the control logic may exist.

Distances PBCL_LTH between the page buffers and the control logic may be different from or equal to each other. In bus precharge, when distances PBCL_LTH between the page buffers and the control logic are different from each other, the bus precharge controller 127 may generate a bus precharge signal PBUS_N during different bus precharge times BP_TIME. When distances PBCL_LTH between the page buffers and the control logic are equal to each other, the bus precharge controller 127 may generate a bus precharge signal PBUS_N during the same bus precharge time BP_TIME.

When a distance between any one page buffer of the first column of FIG. 10B and the control logic is relatively shorter than that between another page buffer and the control logic, a bus precharge time BP_TIME set for each page buffer may be relatively short, when data is transmitted from the cache latch to the main latch or when data is transmitted from the main latch to the cache latch. On the contrary, when a distance PBCL_LTH between any one page buffer and the control logic is relatively longer than that between another page buffer and the control logic, the set bus precharge time BP_TIM may be long.

Figure 11:
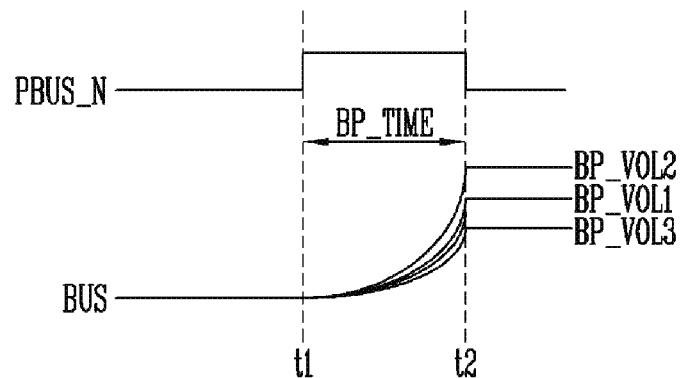
FIG. 11 is a diagram illustrating an embodiment in which a voltage level of the bus is set.

FIG. 11 is a diagram illustrating an embodiment in which a voltage level of the bus is set.

Referring to FIG. 11, FIG. 11 illustrates a bus precharge signal PBUS_N applied to the gate of the bus precharge transistor during a bus precharge time BP_TIME and a change in voltage of the bus. The bus precharge controller 127 may set a voltage level of the bus, based on the bus precharge signal PBUS_N and a bus precharge voltage BP_VOL applied to the bus.

In FIG. 11, a case where the bus precharge time BP_TIME is fixed is assumed. In another embodiment, the bus precharge time BP_TIME may be set according to a distance PBCL_LTH between the page buffer and the control logic.

At t1 to t2, a bus precharge signal PBUS_N may be generated. That is, the bus precharge signal PBUS_N may be generated during the bus precharge time BP_TIME. When the bus precharge signal PBUS_N is generated, a bus precharge transistor coupled to the bus may be turned on. When the bus precharge transistor is turned on, a power voltage VCORE may be applied to the bus. When the power voltage VCORE is applied to the bus, the bus may be precharged. A level of the power voltage VCORE may become that of the voltage of the bus.

In an embodiment, when the bus precharge controller 127 generates a power voltage VCORE, based on a position of the page buffer, the power voltage VCORE may be used as a bus precharge voltage BP_VOL. Therefore, the bus precharge voltage BP_VOL may be applied to the bus. Also, since the bus precharge controller 127 generates the power voltage VCORE, based on the position of the page buffer, the bus may be precharged to bus precharge voltage BP_VOL levels having different magnitude according to the position of the page buffer.

In FIG. 11, the bus precharge controller 127 may generate a power voltage VCORE having a first bus precharge voltage BP_VOL1 level and apply the generated power voltage VCORE to the bus during the bus precharge time BP_TIME.

However, when the distance PBCL_LTH between the page buffer and the control logic is relatively longer than that when the power voltage VCORE having the first bus precharge voltage BP_VOL1 level is applied, the bus precharge controller 127 may generate a power voltage VCORE having a second bus precharge voltage BP_VOL2 level higher than the first bus precharge voltage BP_VOL1 level and apply the generated power voltage VCORE to the bus during the bus precharge time BP_TIME. On the contrary, when the distance PBCL_LTH between the page buffer and the control logic is relatively shorter than that when the power voltage VCORE having the first bus precharge voltage BP_VOL1 level is applied, the bus precharge controller 127 may generate a power voltage VCORE having a third bus precharge voltage BP_VOL3 lower than the first bus precharge voltage BP_VOL1 level and apply the generated power voltage VCORE to the bus during the bus precharge time BP_TIME.

In an embodiment, when the power voltage VCORE is applied to the bus during the bus precharge time BP_TIME, the voltage of the bus may reach a target voltage after the bus precharge time BP_TIME elapses. That is, when the power voltage VCORE having the first bus precharge voltage BP_VOL1 level is applied to the bus during the bus precharge time BP_TIME, the voltage of the bus may become a first bus precharge voltage BP_VOL1. When the power voltage VCORE having the second bus precharge voltage BP_VOL2 level is applied to the bus during the bus precharge time BP_TIME, the voltage of the bus may become a second bus precharge voltage BP_VOL2. When the power voltage VCORE having the third bus precharge voltage BP_VOL3 level is applied to the bus during the bus precharge time BP_TIME, the voltage of the bus may become a third bus precharge voltage BP_VOL3.

Figure 12:
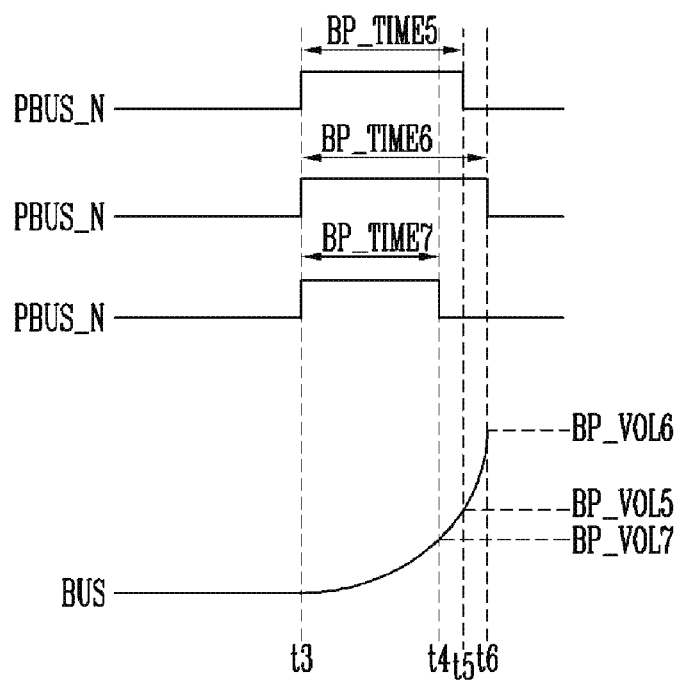
FIG. 12 is a diagram illustrating another embodiment in which a voltage level of the bus is set.

FIG. 12 is a diagram illustrating another embodiment in which a voltage level of the bus is set.

Referring to FIG. 12, FIG. 12 illustrates a bus precharge signal PBUS_N applied to the gate of the bus precharge transistor during different precharge times BP_TIME and a change in voltage of the bus. The bus precharge controller 127 may set a voltage level of the bus, based on the bus precharge signal PBUS_N and a bus precharge voltage BP_VOL applied to the bus.

In FIG. 12, a case where the bus precharge voltage BP_VOL is fixed is assumed. In another embodiment, the bus precharge voltage BP_VOL according to a distance PBCL_LTH between the page buffer and the control logic.

At t3 to t5, a bus precharge signal PBUS_N may be generated. That is, an interval of t3 to t5 may be a fifth bus precharge time BP_TIME5. A bus precharge signal PBUS_N may be generated during the fifth bus precharge time BP_TIME5. When the bus precharge signal PBUS_N is generated during the fifth bus precharge time BP_TIME5, the bus precharge transistor coupled to the bus may be turned on. When the bus precharge transistor is turned on, a power voltage VCORE may be applied to the bus. When the power voltage VCORE is applied to the bus, the bus may be precharged. A level of the power voltage VCORE may become that of the voltage of the bus.

In an embodiment, when the bus precharge controller 127 sets a bus precharge time BP_TIME, based on a position of the page buffer, a bus precharge voltage BP_VOL may be applied to the bus during a bus precharge time BP_TIME. Since the bus precharge controller 127 sets the bus precharge time, based on the position of the page buffer, a bus precharge signal PBUS_N may be generated during different bus precharge times according to the position of the page buffer. Therefore, a power voltage VCORE may be applied to the bus during different bus precharge time.

In FIG. 12, the bus precharge controller 127 may generate a bus precharge signal PBUS_N during the fifth bus precharge time PB_TIME5. Therefore, at t3 to t5, the power voltage VCORE may be applied to the bus.

However, when the distance PBCL_LTH between the page buffer and the control logic is relatively longer than that when the bus precharge signal PBUS_N is generated during the fifth bus precharge time PB_TIME5, the bus precharge controller 127 may generate a bus precharge signal PBUS_N during a sixth bus precharge time BP_TIME6 longer than the fifth bus precharge time PB_TIME5. On the contrary, when the distance PBCL_LTH between the page buffer and the control logic is relatively shorter than that when the bus precharge signal PBUS_N is generated during the fifth bus precharge time PB_TIME5, the bus precharge controller 127 may generate a bus precharge signal PBUS_N during a seventh bus precharge time BP_TIME7 shorter than the fifth bus precharge time PB_TIME5.

In an embodiment, during a bus precharge time, when the power voltage VCORE is applied to the bus, the voltage of the bus may reach a bus precharge voltage that is a target voltage, after the bus precharge time elapses.

Therefore, when the bus precharge signal PBUS_N is generated during the fifth bus precharge time BP_TIME5, the voltage of the bus may become a fifth bus precharge voltage BP_VOL5. When the bus precharge signal PBUS_N is generated during the sixth bus precharge time BP_TIME6, the voltage of the bus may become a sixth bus precharge voltage BP_VOL6. When the bus precharge signal PBUS_N is generated during the seventh bus precharge time BP_TIME, the voltage of the bus may become a seventh bus precharge voltage BP_VOL7.

FIGS. 13A and 13B are diagrams illustrating an evaluation time and an acquisition time.

Referring to FIGS. 13A and 13B, FIG. 13A illustrates evaluation time EVAL_TIME according to distance PBCL_LTH between the page buffer and the control logic, and FIG. 13B illustrates acquisition time CTH_TIME according to distance PBCL_LTH between the page buffer and the control logic. The evaluation time EVAL_TIME may be a time taken to transmit data stored in the cache latch to the bus or to store data transmitted to the bus in the cache latch. The acquisition time CTH_TIME may be a time taken to transmit data stored in the main latch to the bus or to store data transmitted to the bus in the main latch.

Referring to FIG. 13A, a first column of FIG. 13A represents distance PBCL_LTH between the page buffer and the control logic, and a second column of FIG. 13A represents evaluation time EVAL_TIME corresponding to the distance PBCL_LTH between the page buffer and the control logic. That is, the evaluation time EVAL_TIME may be determined according to a position of the page buffer.

In an embodiment, a voltage corresponding to a first distance PBCL_LTH1 of the first column may be a first evaluation time EVAL_TIME1, a voltage corresponding to a second distance PBCL_LTH2 of the first column may be a second evaluation time EVAL_TIME2, a voltage corresponding to a third distance PBCL_LTH3 of the first column may be a third evaluation time EVAL_TIME3, and a voltage corresponding to a fourth distance PBCL_LTH4 of the first column may be a fourth evaluation time EVAL_TIME4.

A number of distances PBCL_LTH between page buffers and the control logic, which are included in the first column of FIG. 13A may be smaller than or equal to that of page buffers included in the read/write circuit. That is, page buffers having the same distance PBCL_LTH from the control logic may exist.

Distances PBCL_LTH between the page buffers and the control logic may be different from or equal to each other. When the distances PBCL_LTH between the page buffers and the control logic are different from each other in a data transmission process, the latch controller 128 may set different evaluation times EVAL_TIME. When the distances PBCL_LTH between the page buffers and the control logic are equal to each other, the bus precharge controller 127 may set the same evaluation time EVAL_TIME.

When a distance between any one page buffer of the first column of FIG. 13A and the control logic is relatively shorter than that between another page buffer and the control logic, an evaluation time EVAL_TIME set when data is transmitted from the cache latch to the main latch or when data is transmitted from the main latch to the cache latch may be relatively short. On the contrary, when a distance between any one page buffer of the first column and the control logic is relatively longer than that between another page buffer and the control logic, the set evaluation time EVAL_TIME may be long.

Referring to FIG. 13B, a first column of FIG. 13B represents distance PBCL_LTH between the page buffer and the control logic, and a second column of FIG. 13B represents acquisition time CTH_TIME corresponding to the distance PBCL_LTH between the page buffer and the control logic. That is, the acquisition time CTH_TIME may be determined according to a position of the page buffer.

In an embodiment, a time corresponding to a first distance PBCL_LTH1 of the first column may be a first acquisition time CTH_TIME1, a time corresponding to a second distance PBCL_LTH2 of the first column may be a second acquisition time CTH_TIME2, a time corresponding to a third distance PBCL_LTH3 of the first column may be a third acquisition time CTH_TIME3, and a time corresponding to a fourth distance PBCL_LTH3 of the first column may be a fourth acquisition time CTH_TIME4.

A number of distances PBCL_LTH between page buffers and the control logic, which are included in the first column of FIG. 13B may be smaller than or equal to that of page buffers included in the read/write circuit. That is, page buffers having the same distance PBCL_LTH from the control logic may exist.

Distances PBCL_LTH between the page buffers and the control logic may be different from or equal to each other. When the distances PBCL_LTH between the page buffers and the control logic are different from each other in a data transmission process, the latch controller 128 may set different acquisition times CTH_TIME. When the distances PBCL_LTH between the page buffers and the control logic are equal to each other, the bus precharge controller 127 may set the same acquisition time CTH_TIME.

When a distance between any one page buffer of the first column of FIG. 13B and the control logic is relatively shorter than that between another page buffer and the control logic, an acquisition time CTH_TIME set when data is transmitted from the cache latch to the main latch or when data is transmitted from the main latch to the cache latch may be relatively short. On the contrary, when a distance between any one page buffer of the first column and the control logic is relatively longer than that between another page buffer and the control logic, the set acquisition time CTH_TIME may be long.

Figure 14:
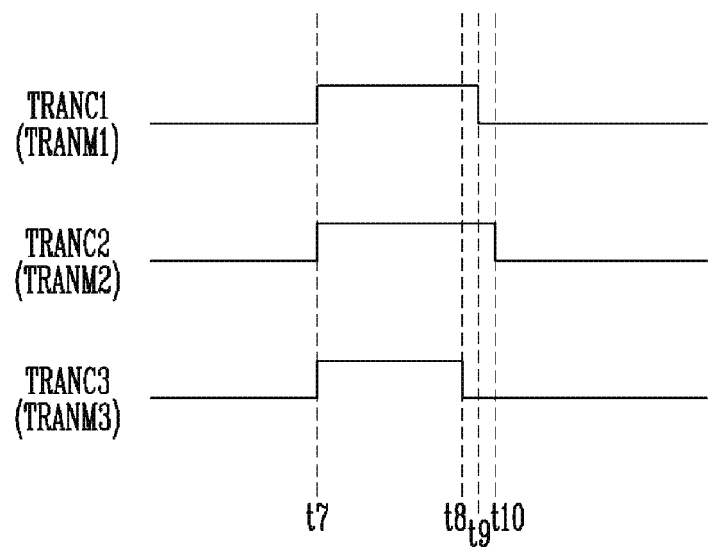
FIG. 14 is a diagram illustrating a method for setting an evaluation time and an acquisition time.

FIG. 14 is a diagram illustrating a method for setting an evaluation time and an acquisition time.

Referring to FIG. 14, FIG. 14 illustrates an evaluation signal TRANC and an acquisition signal TRANM. The evaluation signal TRANC may be a signal applied to the gate of the evaluation transistor. The acquisition signal TRANM may be a signal applied to the gate of the acquisition transistor. Times at which the evaluation signal TRANC and the acquisition signal TRANM are generated may be variously set according to a distance PBCL_LTH between the page buffer and the control logic. The latch controller 128 may generate the evaluation signal TRANC and the acquisition signal TRANM, based on a position of the page buffer.

In an embodiment, the evaluation signal TRANC may be generated when data stored in the cache latch is transmitted to the bus or when data transmitted through the bus is stored in the cache latch. In an embodiment, the acquisition signal TRANM may be generated when data stored in the main latch is transmitted to the bus or when data transmitted through the bus is stored in the main latch. The evaluation signal TRANC and the acquisition signal TRANM may be simultaneously generated when a certain time elapses after the precharge of the bus is completed.

In another embodiment, points of time when the evaluation signal TRANC and the acquisition signal TRANM are generated may be different from each other. In a write operation of the memory device 100, when a certain time elapses after the generation of the evaluation signal TRANC is started, the generation of the acquisition signal TRANM may be started. In a read operation of the memory device 100, when a certain time elapses after the generation of the acquisition signal TRANM is started, the generation of the evaluation signal TRANC may be started.

At t7 to t9, a first evaluation signal TRANC1 and a first acquisition signal TRANM1 may be generated. t7 may be point of time after the bus is precharged. That is, when the bus is precharged, the first evaluation signal TRANC1 and the first acquisition signal TRANM1 may be generated. When the first evaluation signal TRANC1 is generated, data stored in the cache latch may be transmitted to the bus, or data transmitted through the bus may be stored in the cache latch. When the first acquisition signal TRANM1 is generated, data stored in the main latch may be transmitted to the bus, or data transmitted to the bus may be stored in the main latch.

In an embodiment, the latch controller 128 may generate the first evaluation signal TRANC1 and the first acquisition signal TRANM1, based on the position of the page buffer. Therefore, based on the position of the page buffer, the first evaluation signal TRANC1 may be applied to the gate of the evaluation transistor, and the first acquisition signal TRANM1 may be applied to the gate of the acquisition transistor. In addition, since the latch controller 128 generates a power voltage VCORE, based on the position of the page buffer, an evaluation signal and an acquisition signal may be generated during different times according to the position of the page buffer.

In an embodiment, when the distance PBCL_LTH between the page buffer and the control logic is relatively longer than that when the first evaluation signal TRANC1 and the first acquisition signal TRANM1 are generated, the latch controller 128 may generate a second evaluation signal TRANC2 and a second acquisition signal for a time longer than that for which the first evaluation signal TRANC1 and the first acquisition signal TRANM are generated.

That is, when the distance PBCL_LTH between the page buffer and the control logic is relatively longer than that when the first evaluation signal TRANC1 and the first acquisition signal TRANM1 are generated for an interval of t7 to t9, an evaluation signal and an acquisition may be generated for a time longer than the interval of t7 to t9. Therefore, in an embodiment, when the distance PBCL_LTH between the page buffer and the control logic is relatively long, the second evaluation signal TRANC2 and the second acquisition signal TRANM2 may be generated at t7 to t10.

On the contrary, when the distance PBCL_LTH between the page buffer and the control logic is relatively shorter than that when the first evaluation signal TRANC1 and the first acquisition signal TRANM1 are generated for the interval of t7 to t9, an evaluation signal and an acquisition may be generated for a time shorter than the interval of t7 to t9. Therefore, in an embodiment, when the distance PBCL_LTH between the page buffer and the control logic is relatively short, a third evaluation signal TRANC3 and a third acquisition signal TRANM3 may be generated at t7 to t8.

Figure 15:
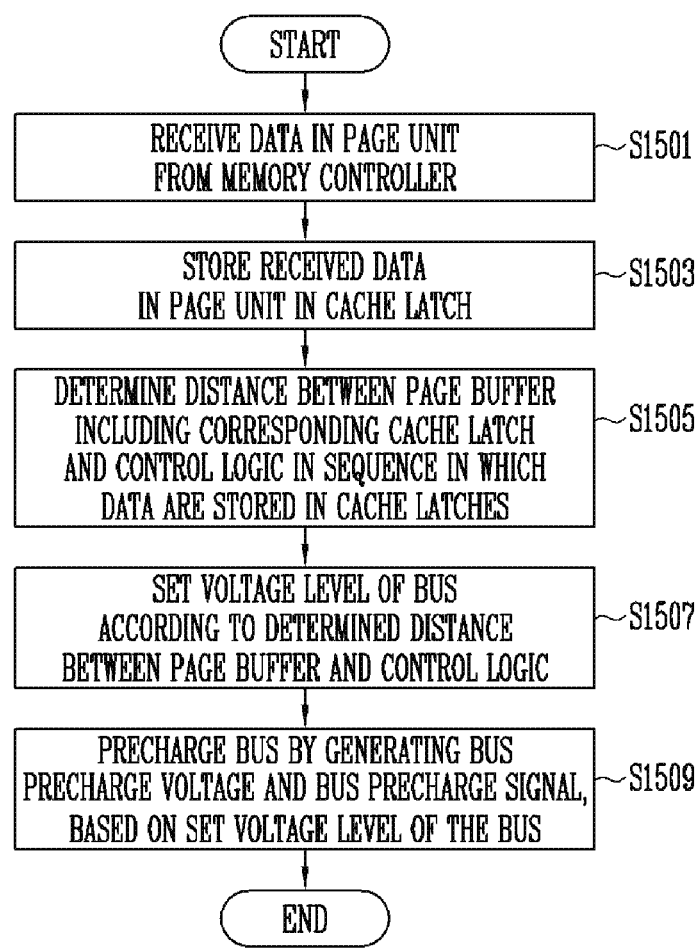
FIG. 15 is a diagram illustrating an operation of the memory device in accordance with an embodiment of the present disclosure.

FIG. 15 is a diagram illustrating an operation of the memory device in accordance with an embodiment of the present disclosure.

Referring to FIG. 15, in step S1501, data may be received in a page unit from the memory controller 200. The data received from the memory controller 200 may be transmitted to a page buffer through the data input/output circuit. The data transmitted to the page buffer may be stored in a plurality of memory cells included in the memory cell array.

In step 1503, the data in the page unit, which is received from the memory controller 200, may be stored in a cache latch. The data received from the memory controller 200 may be stored in the cache latch through the data lines DL coupled to the data input/output circuit. Points of time when the data received from the memory controller 200 is stored in cache latches may be different from or equal to each other.

In step S1505, a distance PBCL_LTH between a page buffer including a corresponding cache latch and the control logic may be determined in a sequence in which the data are stored in the cache latches. That is a position of the page buffer may be determined.

In an embodiment, since points of time when the data in the page unit, which is transmitted from the memory controller 200, is stored in the cache latches are different from each other, an operation for storing the data stored in the cache latch in a main latch, based on the position of the page buffer, may be performed. That is, the bus precharge controller 127 may determine the distance PBCL_LTH between the page buffer including the cache latch and the control logic.

In step S1507, a voltage level of the bus may be set according to the determined distance PBCL_LTH between the page buffer and the control logic. In an embodiment, the bus precharge controller 127 may set the voltage level of the bus, based on the distance PBCL_LTH between the page buffer and the control logic. The bus precharge controller 127 may perform an operation for precharging the bus at the set voltage level of the bus.

For example, the bus precharge controller 127 may generate a bus precharge signal PBUS_N such that, as the distance PBCL_LTH between the page buffer and the control logic becomes shorter, a time for which a power voltage VCORE is applied, when data is transmitted from the cache latch to the main latch or when data is transmitted from the main latch to the cache latch, is set shorter. On the contrary, the bus precharge controller 127 may generate a bus precharge signal PBUS_N such that, as the distance PBCL_LTH between the page buffer and the control logic becomes longer, a time for which a power voltage VCORE is applied, when data is transmitted from the cache latch to the main latch or when data is transmitted from the main latch to the cache latch, is set longer.

In addition, as the distance PBCL_LTH between the page buffer and the control logic becomes shorter, the precharge controller 127 may allow a bus precharge voltage BP_VOL at which the bus is precharged to become lower, when data is transmitted from the cache latch to the main latch or when data is transmitted from the main latch to the cache latch. On the contrary, as the distance PBCL_LTH between the page buffer and the control logic becomes longer, the precharge controller 127 may allow a bus precharge voltage BP_VOL at which the bus is precharged to become higher, when data is transmitted from the cache latch to the main latch or when data is transmitted from the main latch to the cache latch.

In step S1509, the bus precharge controller 127 may precharge the bus by generating a power voltage VCORE and a bus precharge signal PBUS_N, based on the set voltage level of the bus. The set voltage level of the bus may be determined according to the distance PBCL_LTH between the page buffer and the control logic.

In an embodiment, the bus precharge controller 127 may generate a power voltage VCORE so as to precharge the bus at the set voltage level of the bus. The power voltage VCORE may be a voltage applied to the bus.

In an embodiment, the bus precharge controller 127 may generate a bus precharge signal PBUS_N so as to precharge the bus at the set voltage level of the bus. The bus precharge signal PBUS_N may be applied to the gate of the bus precharge transistor during a set bus precharge time BP_TIME. The bus precharge time BP_TIME may be determined according to the distance PBCL_LTH between the page buffer and the control logic.

Figure 16:
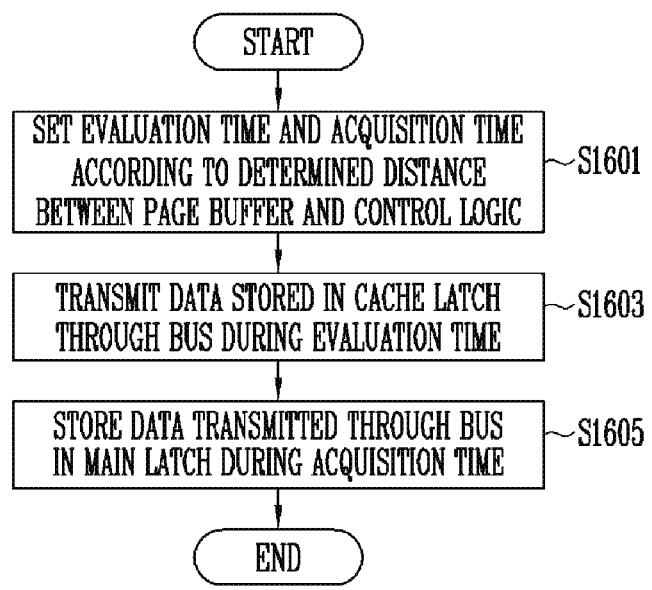
FIG. 16 is a diagram illustrating an operation of the memory device in accordance with an embodiment of the present disclosure.

FIG. 16 is a diagram illustrating an operation of the memory device in accordance with an embodiment of the present disclosure.

Referring to FIGS. 15 and 16, steps shown in FIG. 16 are steps that may be additionally performed after the step S1509. That is, FIG. 16 illustrates an operation after the bus is precharged, when data is transmitted from the cache latch to the main latch.

In step S1601, an evaluation time EVAL_TIME and an acquisition time CTH_TIME may be set according to the distance PBCL_LTH between the page buffer and the control logic, where the transmission of data or the storage of data is determined. The evaluation time EVAL_TIME may be a time for which data is transmitted from the cache latch to the bus or a time for which data transmitted to the bus is stored in the cache latch. The evaluation time EVAL_TIME may be set according to the distance PBCL_LTH between the page buffer and the control logic, where the transmission of data or the storage of data is determined.

In an embodiment, as the distance PBCL_LTH between the page buffer and the control logic, where the transmission of data or the storage of data is determined, becomes shorter, the latch controller 128 may generate an evaluation signal TRANC such that the evaluation time EVAL_TIME is set shorter. The evaluation signal TRANC may be a voltage applied to the gate of the evaluation transistor. Therefore, the latch controller 128 may generate the evaluation signal TRANC such that the evaluation time EVAL_TIME is set short, when data is transmitted from the cache latch to the main latch or when data is transmitted from the main latch to the cache latch. When the evaluation time EVAL_TIME is set, the latch controller 128 may apply the evaluation signal TRANC to the gate of the evaluation transistor during the evaluation time EVAL_TIME.

In an embodiment, the latch controller 128 may generate an acquisition signal TRANM such that the acquisition time CTH_TIME is set shorter, as the distance PBCL_LTH between the page buffer and the control logic, where the transmission of data or the storage of data is determined, becomes shorter. The acquisition signal TRANM may be a voltage applied to the gate of the acquisition transistor. Therefore, the latch controller 128 may generate the acquisition signal TRANM such that the acquisition time CTH_TIM is set short, when data is transmitted from the cache latch to the main latch or when data is transmitted from the main latch to the cache latch. When the acquisition time CTH_TIME is set, the latch controller 128 may apply the acquisition signal TRANM to the gate of the acquisition transistor during the acquisition time CTH_TIME.

In step S1603, the data stored in the cache latch may be transmitted through the bus during the evaluation time EVAL_TIME. For example, when the latch controller 128 applies the evaluation signal TRANC to the gate of the evaluation transistor, based on a position of the page buffer, the evaluation transistor may be turned on. When the evaluation transistor is turned on, the data stored in the cache latch may be transmitted to the bus through the evaluation transistor. Therefore, during the evaluation time EVAL_TIME, the evaluation transistor may maintain the turn-on state, and the data stored in the cache latch may be transmitted to the bus.

In step S1605, the data transmitted through the bus may be stored in the main latch during the acquisition time CTH_TIME. For example, when the latch controller 128 applies the acquisition signal TRANM to the gate of the acquisition transistor, based on the position of the page buffer, the acquisition transistor may be turned on. When the acquisition transistor is turned on, the data transmitted through the bus may be transmitted to the main latch through the acquisition transistor. The main latch may store the data transmitted through the bus. Therefore, during the acquisition time CTH_TIME, the acquisition transistor may maintain the turn-on state, and the data transmitted through the bus may be stored in the main latch.

Figure 17:
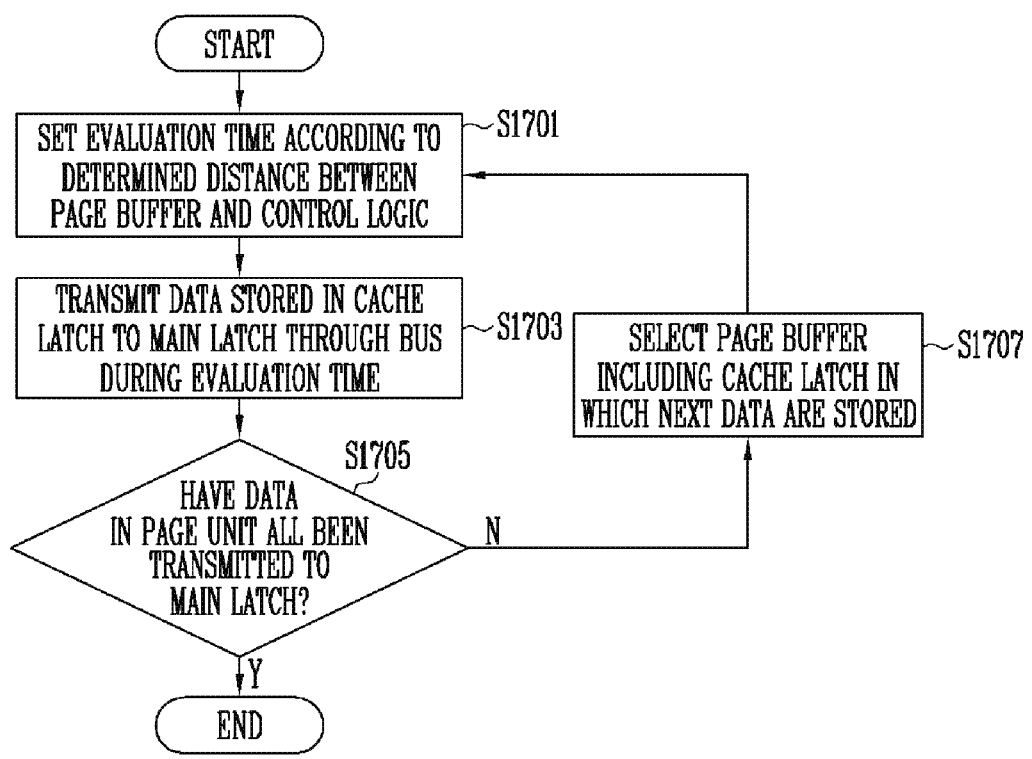
FIG. 17 is a diagram illustrating an operation of the memory device in accordance with an embodiment of the present disclosure.

FIG. 17 is a diagram illustrating an operation of the memory device in accordance with an embodiment of the present disclosure.

Referring to FIGS. 16 and 17, FIG. 17 is a diagram illustrating in more detail the steps S1601 and S1603. For example, step S1701 corresponds to the step S1601, and steps S1703 to S1707 correspond to the step S1603.

In the step S1701, an evaluation time EVAL_TIME may be set according to the determined distance PBCL_LTH between the page buffer and the control logic. The evaluation time EVAL_TIME may be a time for which data is transmitted from the cache latch to the bus or a time for which data transmitted to the bus is stored in the cache latch. The evaluation time EVAL_TIME may be set according to the distance PBCL_LTH between the page buffer and the control logic 125, where the transmission of data or the storage of data is determined.

In an embodiment, as the distance PBCL_LTH between the page buffer and the control logic, where the transmission of data or the storage of data is determined, becomes shorter, the latch controller 128 may generate an evaluation signal TRANC such that the evaluation time EVAL_TIME is set shorter. The evaluation signal TRANC may be a voltage applied to the gate of the evaluation transistor. Therefore, the latch controller 128 may generate the evaluation signal TRANC such that the evaluation time EVAL_TIME is set short, when data is transmitted from the cache latch to the main latch or when data is transmitted from the main latch to the cache latch. When the evaluation time EVAL_TIME is set, the latch controller 128 may apply the evaluation signal TRANC to the gate of the evaluation transistor during the evaluation time EVAL_TIME.

In the step S1703, the memory device 100 may transmit the data stored in the cache latch to the main latch through the bus during the evaluation time EVAL_TIME. For example, the data stored in the cache latch may be transmitted to the main latch through the bus, in a sequence in which data received from the memory controller 200 are stored in the cache latches.

In an embodiment, the bus may be precharged after the data received from the memory controller 200 is stored in the cache latch. Subsequently, when an evaluation signal TRANC is applied to the gate of the evaluation transistor, the data stored in the cache latch may be transmitted to the main latch through the bus during the evaluation time EVAL_TIME for which the evaluation signal TRANC is applied to the evaluation transistor.

In the step S1705, it may be determined whether the data in the page unit have all been transmitted to the main latch. For example, data in the page unit may be received from the memory controller 200. The data stored in the cache latch may be transmitted to the main latch in a sequence in which the data in the page unit are stored in the cache latches. When the data in the page unit are all stored in the main latch, the memory device 100 may again receive data in the page unit from the memory controller 200. When the data in the page unit are not all transmitted to the main latch, the operation proceeds to the step S1707.

In the step S1707, a page buffer including a cache latch in which next data is stored may be selected. That is, since points of time when the data in the page unit, which are received from the memory controller 200, are stored in the cache latches are different from each other, a page buffer including a cache latch in which next data are stored may be selected, after the data stored in the main latch. When the page buffer is selected, the operation again proceeds to the step S1701.

Figure 18:
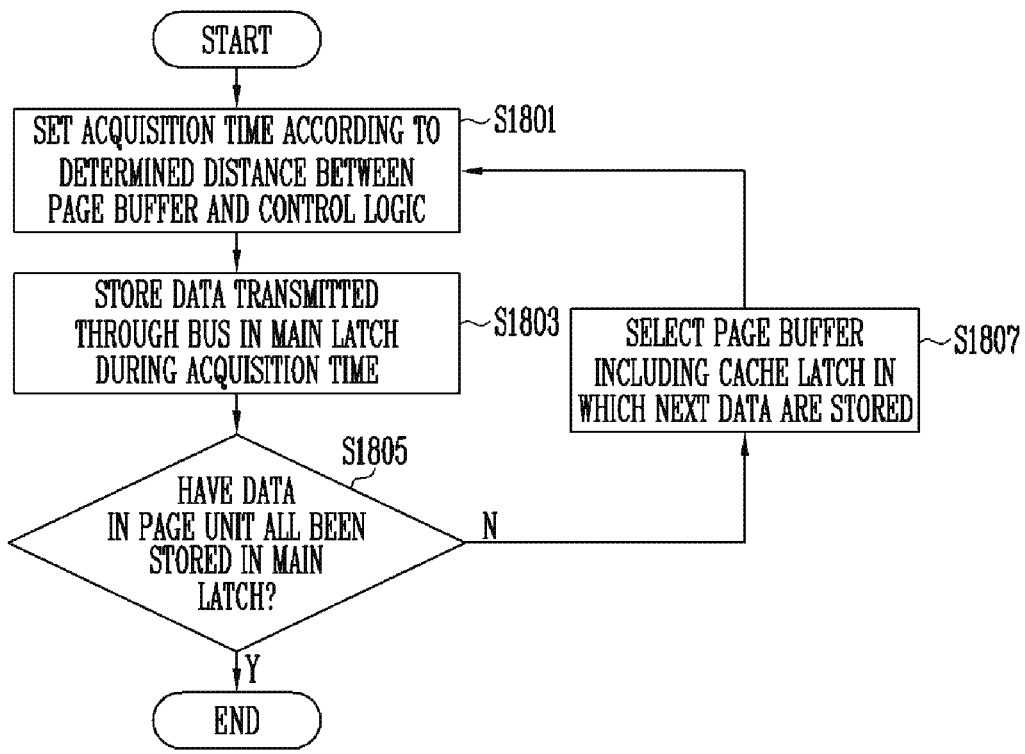
FIG. 18 is a diagram illustrating an operation of the memory device in accordance with an embodiment of the present disclosure.

FIG. 18 is a diagram illustrating an operation of the memory device in accordance with an embodiment of the present disclosure.

Referring to FIGS. 16 and 18, FIG. 18 is a diagram illustrating in more detail the steps S1601 and S1605. For example, step S180 corresponds to the step S1601, and steps S1803 to S1807 correspond to the step S1605.

In step S1801, an acquisition time CTH_TIME may be set according to the determined distance PBCL_LTH between the page buffer and the control logic. The acquisition time CTH_TIME may be a time for data is transmitted from the main latch to the bus or a time for which data transmitted to the bus is stored in the main latch. The acquisition time CTH_TIME may be set according to the distance PBCL_LTH between the page buffer and the control logic 125, where the transmission of data or the storage of data is determined.

In an embodiment, the latch controller 128 may generate an acquisition signal TRANM such that the acquisition time CTH_TIME is set shorter, as the distance PBCL_LTH between the page buffer and the control logic, where the transmission of data or the storage of data is determined, becomes shorter. The acquisition signal TRANM may be a voltage applied to the gate of the acquisition transistor. Therefore, the latch controller 128 may generate the acquisition signal TRANM such that the acquisition time CTH_TIM is set short, when data is transmitted from the cache latch to the main latch or when data is transmitted from the main latch to the cache latch. When the acquisition time CTH_TIME is set, the latch controller 128 may apply the acquisition signal TRANM to the gate of the acquisition transistor during the acquisition time CTH_TIME.

In the step S1803, the memory device 100 may store data transmitted through the bus in the main latch during the acquisition time CTH_TIME. For example, the data stored in the cache latch may be transmitted to the main latch through the bus in a sequence in which the data received from the memory controller 200 are stored in the cache latches, and the received data may be stored in the main latch.

In an embodiment, the bus may be precharged after the data received from the memory controller 200. Subsequently, when an acquisition signal TRANM is applied to the gate of the acquisition transistor, the data transmitted through the bus may be stored in the main latch during the acquisition time CTH_TIME for which the acquisition signal TRANM is applied to the acquisition transistor.

In the step S1805, it may be determined whether the data in the page unit have all been stored in the main latch. For example, the data transmitted through the bus may be transmitted to the main latch. When the transmitted in the page unit are all stored in the main latch, the memory device 100 may again receive data in the page unit from the memory controller 200. When the data in the page unit are not all stored in the main latch, the operation proceeds to the step S1807.

In the step S1807, a page buffer including a cache latch in which next data is stored may be selected. That is, since points of time when the data in the page unit, which are received from the memory controller 200, are stored in the cache latches are different from each other, a page buffer including a cache latch in which next data are stored may be selected, after the data stored in the main latch. When the page buffer is selected, the operation again proceeds to the step S1801.

Figure 19:
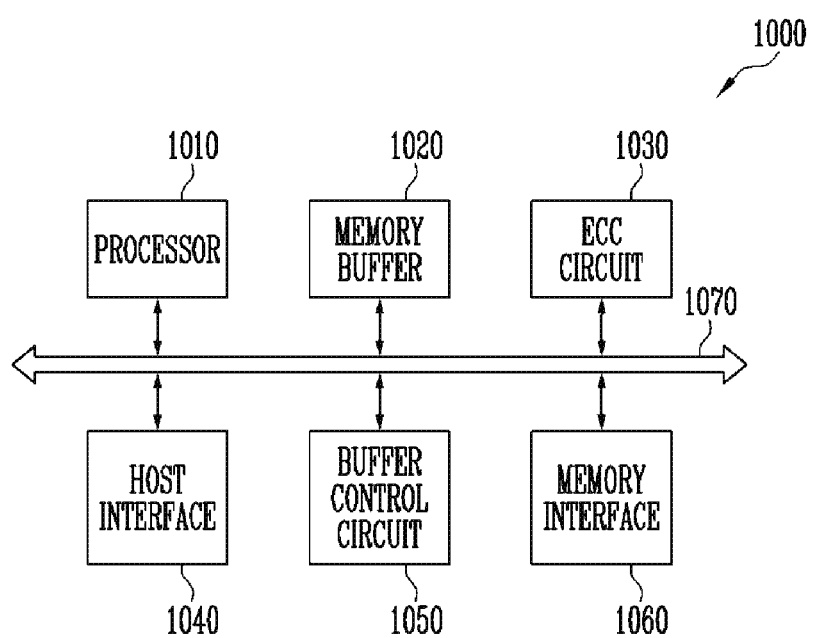
FIG. 19 is a diagram illustrating another embodiment of a memory controller shown in FIG. 1.

FIG. 19 is a diagram illustrating another embodiment of a memory controller shown in FIG. 1.

Referring to FIG. 19, a memory controller 1000 is coupled to a host and a memory device. The memory controller 1000 is configured to access the memory device in response to a request received from the host. For example, the memory controller 1000 is configured to control read, program, erase, and background operations of the memory device. The memory controller 1000 is configured to provide an interface between the memory device and the host. The memory controller 1000 is configured to drive firmware for controlling the memory device.

The memory controller 1000 may include a processor 1010, a memory buffer 1020, an error correction code (ECC) circuit 1030, a host interface 1040, a buffer control circuit 1050, a memory interface 1060, and a bus 1070.

The bus 1070 may be configured to provide channels between components of the memory controller 1000.

The processor 1010 may control overall operations of the memory controller 1000, and perform a logical operation. The processor 1010 may communicate with the external host through the host interface 1040, and communicate with the memory device through the memory interface 1060. Also, the processor 1010 may communicate with the memory buffer 1020 through the buffer control circuit 1050. The processor 1010 may control an operation of the storage device, using the memory buffer 1020 as a working memory, a cache memory or a buffer memory.

The processor 1010 may perform a function of a flash translation layer (FTL). The processor 1010 may translate a logical block address (LBA) provided by the host through the FTL into a physical block address (PBA). The FTL may receive an LPA, using a mapping table, to be translated into a PBA. Several address mapping methods of the FTL exist according to mapping units. A representative address mapping method includes a page mapping method, a block mapping method, and a hybrid mapping method.

The processor 1010 is configured to randomize data received from the host. For example, the processor 1010 may randomize data received from the host, using a randomizing seed. The randomized data is provided as data to be stored to the memory device to be programmed in the memory cell array.

In a read operation, the processor 1010 is configured to derandomize data received from the memory device. For example, the processor 1010 may derandomize data received from the memory device, using a derandomizing seed. The derandomized data may be output to the host.

In an embodiment, the processor 1010 may perform randomizing and derandomizing by driving software or firmware.

The memory buffer 1020 may be used as the working memory, the cache memory, or the buffer memory of the processor 1010. The memory buffer 1020 may store codes and commands, which are executed by the processor 1010. The memory buffer 1020 may include a Static RAM (SRAM) or a Dynamic RAM (DRAM).

The ECC circuit 1030 may perform an ECC operation. The ECC circuit 1030 may perform ECC encoding on data to be written in the memory device through the memory interface 1060. The ECC encoded data may be transferred to the memory device through the memory interface 1060. The ECC circuit 1030 may perform ECC decoding on data received from the memory device through the memory interface 1060. In an example, the ECC circuit 1030 may be included as a component of the memory interface 1060 in the memory interface 1060.

The host interface 1040 may communicate with the external host under the control of the processor 1010. The host interface 1040 may communicate with the host, using at least one of various communication manners, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a nonvolatile memory express (NVMe), a Universal Flash Storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

The buffer control circuit 1050 is configured to control the memory buffer 1020 under the control of the processor 1010.

The memory interface 1060 is configured to communicate with the memory device under the control of the processor 1010. The memory interface 1060 may communicate a command, an address, and data with the memory device through a channel.

In an example, the memory controller 1000 may not include the memory buffer 1020 and the buffer control circuit 1050.

In an example, the processor 1010 may control an operation of the memory controller 1000 by using codes. The processor 1010 may load codes from a nonvolatile memory device (e.g., a read only memory (ROM)) provided in the memory controller 1000. In another example, the processor 1010 may load codes from the memory device through the memory interface 1060.

In an example, the bus 1070 of the memory controller 1000 may be divided into a control bus and a data bus. The data bus may be configured to transmit data in the memory controller 1000, and the control bus may be configured to transmit control information such as a command and an address in the memory controller 1000. The data bus and the control bus are separated from each other, and may not interfere or influence with each other. The data bus may be coupled to the host interface 1040, the buffer control circuit 1050, the ECC circuit 1030, and the memory interface 1060. The control bus may be coupled to the host interface 1040, the processor 1010, the buffer control circuit 1050, the memory buffer 1020, and the memory interface 1060.

Figure 20:
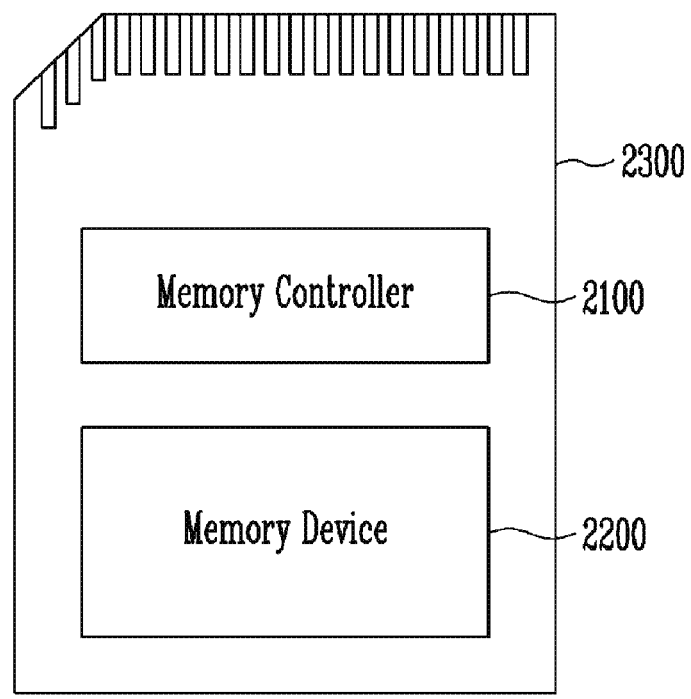
FIG. 20 is a block diagram illustrating a memory card system to which the storage device is applied in accordance with an embodiment of the present disclosure.

FIG. 20 is a block diagram illustrating a memory card system to which the storage device is applied in accordance with an embodiment of the present disclosure.

Referring to FIG. 20, the memory card system 2000 includes a memory controller 2100, a memory device, and a connector 2300.

The memory controller 2100 is coupled to the memory device 2200. The memory controller 2100 is configured to access the memory device 2200. For example, the memory controller 2100 is configured to control read, write, erase, and background operations of the memory device 2200. The memory controller 2100 is configured to provide an interface between the memory device 2200 and a host. The memory controller 2100 is configured to driver firmware for controlling the memory device 2200. The memory device 2200 may be implemented identically to the memory device 100 described with reference to FIG. 2.

In an example, the memory controller 2100 may include components such as a Random Access Memory (RAM), a processing unit, a host interface, a memory interface, and the error corrector 233.

The memory controller 2100 may communicate with an external device through the connector 2300. The memory controller 2100 may communicate with the external device (e.g., the host) according to a specific communication protocol. In an example, the memory controller 2100 may communicate with the external device through at least one of various communication protocols such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), firewire, a Universal Flash Storage (UFS), Wi-Fi, Bluetooth, and NVMe.

In an example, the memory device 2200 may be implemented with various nonvolatile memory devices such as an Electrically Erasable and Programmable ROM (EEPROM), a NAND flash memory, a NOR flash memory, a Phase-change RAM (PRAM), a Resistive RAM (ReRAM), a Ferroelectric RAM (FRAM), and a Spin Torque Transfer magnetic RAM (STT-MRAM).

The memory controller 2100 and the memory device 2200 may be integrated into a single semiconductor device, to constitute a memory card. For example, the memory controller 2100 and the memory device 2200 may constitute a memory card such as a PC card (Personal Computer Memory Card International Association (PCMCIA)), a Compact Flash (CF) card, a Smart Media Card (SM and SMC), a memory stick, a Multi-Media Card (MMC, RS-MMC, MMCmicro and eMMC), an SD card (SD, miniSD, microSD and SDHC), and a Universal Flash Storage (UFS).

Figure 21:
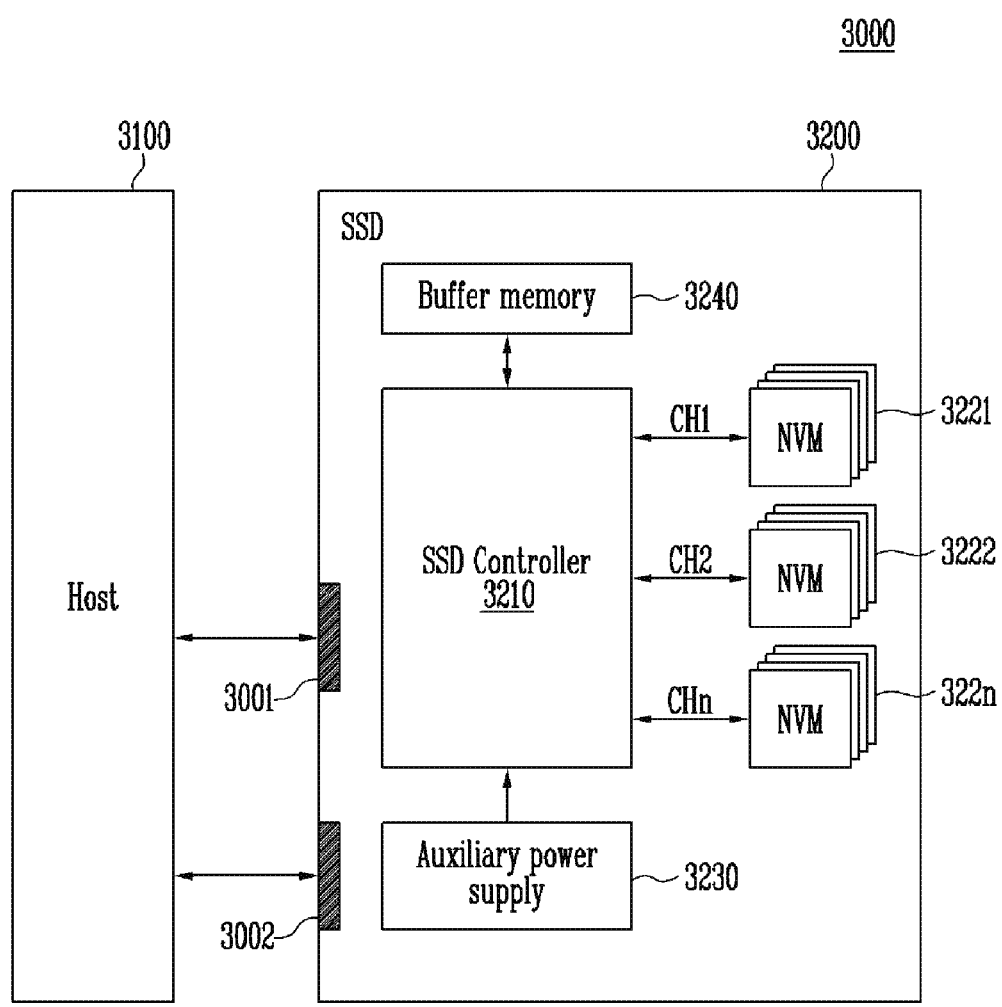
FIG. 21 is a block diagram exemplarily illustrating a Solid State Drive (SSD) system to which the storage device is applied in accordance with an embodiment of the present disclosure.

FIG. 21 is a block diagram exemplarily illustrating a Solid State Drive (SSD) system to which the storage device is applied in accordance with an embodiment of the present disclosure.

Referring to FIG. 21, the SSD system 3000 includes a host 3100 and an SSD 3200. The SSD 3200 exchanges a signal SIG with the host 3100 through a signal connector 3001, and receives power PWR through a power connector 3002. The SSD 3200 includes an SSD controller 3210, a plurality of flash memories 3221 to 322$n$, an auxiliary power supply 3230, and a buffer memory 3240.

In an embodiment, the SSD controller 3210 may serve as the memory controller 200 described with reference to FIG. 1.

The SSD controller 3210 may control the plurality of flash memories 3221 to 322$n$ in response to a signal SIG received from the host 3100. In an example, the signal SIG may be a signal based on an interface between the host 3100 and the SSD 3200. For example, the signal SIG may be a signal defined by at least one of interfaces such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), a firewire, a Universal Flash Storage (UFS), a WI-FI, a Bluetooth, and an NVMe.

The auxiliary power supply 3230 is coupled to the host 3100 through the power connector 3002. When the supply of power from the host 3100 is not smooth, the auxiliary power supply 3230 may provide power of the SSD 3200. In an example, the auxiliary power supply 3230 may be located in the SSD 3200, or be located at the outside of the SSD 3200. For example, the auxiliary power supply 3230 may be located on a main board, and provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322$n$, or temporarily store meta data (e.g., a mapping table) of the flash memories 3221 to 322$n$. The buffer memory 3240 may include volatile memories such as a DRAM, an SDRAM, a DDR SDRAM, an LPDDR SDRAM, and a GRAM or nonvolatile memories such as a FRAM, a ReRAM, an STT-MRAM, and a PRAM.

Figure 22:
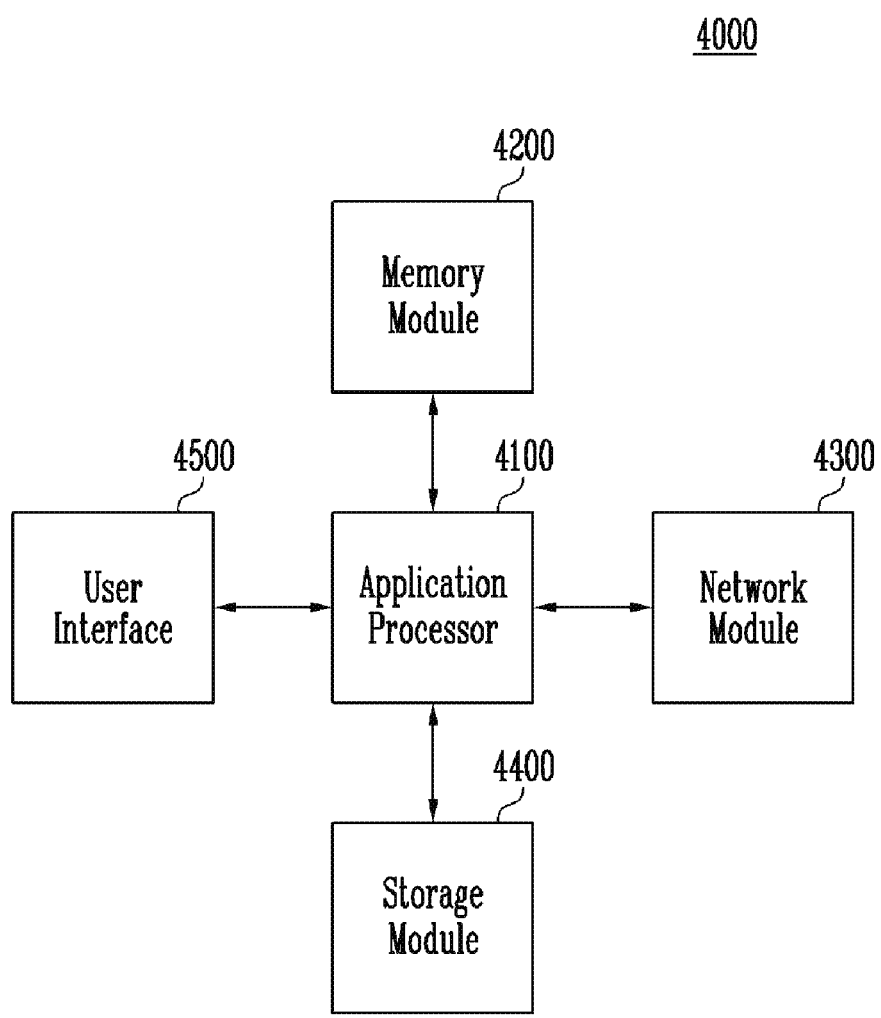
FIG. 22 is a block diagram illustrating a user system to which the storage device is applied in accordance with an embodiment of the present disclosure.

FIG. 22 is a block diagram illustrating a user system to which the storage device is applied in accordance with an embodiment of the present disclosure.

Referring to FIG. 22, the user system 4000 includes an application processor 4100, a memory module 4200, a network module 4300, a storage module 4400, and a user interface 4500.

The application processor 4100 may drive components included in the user system 4000, an operating system (OS), a user program, or the like. In an example, the application processor 4100 may include controllers for controlling components included in the user system 4000, interfaces, a graphic engine, and the like. The application processor 4100 may be provided as a System-on-Chip (SoC).

The memory module 4200 may operate as a main memory, working memory, buffer memory or cache memory of the user system 4000. The memory module 4200 may include volatile random access memories such as a DRAM, an SDRAM, a DDR SDRAM, a DDR2 SDRM, a DDR3 SDRAM, an LPDDR SDRAM, an LPDDR2 SDRAM, and an LPDDR3 SDRAM or nonvolatile random access memories such as a PRAM, a ReRAM, an MRAM, and a FRAM. In an example, the application processor 4100 and the memory module 4200 may be provided as one semiconductor package by being packaged based on a Package on Package (PoP).

The network module 4300 may communicate with external devices. In an example, the network module 4300 may support wireless communications such as Code Division Multiple Access (CDMA), Global System for Mobile communication (GSM), Wideband CDMA (WCDMA), CDMA-2000, Time Division Multiple Access (TDMA), Long Term Evolution (LTE), Wimax, WLAN, UWB, Bluetooth, and Wi-Fi. In an example, the network module 4300 may be included in the application processor 4100.

The storage module 4400 may store data. For example, the storage module 4400 may store data received from the application processor 4100. Alternatively, the storage module 4400 may transmit data stored therein to the application processor 4100. In an example, the storage module 4400 may be implemented with a nonvolatile semiconductor memory device such as a Phase-change RAM (PRAM), a Magnetic RAM (MRAM), a Resistive RAM (RRAM), a NAND flash, a NOR flash, or a NAND flash having a three-dimensional structure. In an example, the storage module 4400 may be provided as a removable drive such as a memory card of the user system 4000 or an external drive.

In an example, the storage module 4400 may include a plurality of nonvolatile memory devices, and the plurality of nonvolatile memory devices may operate identically to the memory device described with reference to FIGS. 2 and 5 to 7. The storage module 4400 may operate identically to the storage device 50 described with reference to FIG. 1.

The user interface 4500 may include interfaces for inputting data or commands to the application processor 4100 or outputting data to an external device. In an example, the user interface 4500 may include user input interfaces such as a keyboard, a keypad, a button, a touch panel, a touch screen, a touch pad, a touch ball, a camera, a microphone, a gyroscope sensor, a vibration sensor and a piezoelectric element. The user interface 4500 may include user output interfaces such as a Liquid Crystal Display (LCD), an Organic Light Emitting Diode (OLED) display device, an Active Matrix OLED (AMOLED) display device, an LED, a speaker, and a monitor.

In accordance with the present disclosure, there can be provided a memory device for controlling a page buffer to ensure the reliability of data and an operating method of the memory device.

While the present disclosure has been shown and described with reference to certain examples of embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described examples of embodiments but should be determined by not only the appended claims but also the equivalents thereof.

In the above-described embodiments, all steps may be selectively performed or part of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the examples of embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A memory device comprising:
a memory cell array including a plurality of memory cells configured for storing data;
first and second page buffers respectively including main latches and cache latches, which are coupled to a bus, the first and second page buffers being connected to the memory cell array respectively through bit lines coupled to the main latches; and
control logic including a bus precharge controller configured to differently set a voltage level of the bus, based on a distance between a reference position and the first page buffer and a distance between the reference position and the second page buffer, for precharging of the bus for transmitting data of a cache latch included in each of the first and second page buffers to a corresponding main latch.

2. The memory device of claim 1, wherein the bus precharge controller generates a power voltage having a bus precharge level, which is applied to the bus, and a bus precharge signal for turning on a bus precharge transistor coupled to the bus.

3. The memory device of claim 2, wherein the bus precharge transistor is implemented with a transistor.

4. The memory device of claim 2, wherein, when a distance between the first page buffer and the control logic is relatively shorter than that between the second page buffer and the control logic, the bus precharge controller generates the bus precharge signal such that a time for which the power voltage is applied when data is transmitted from the cache latch included in the first page buffer to the main latch included in the first page buffer is set relatively shorter than that for which the power voltage is applied when data is transmitted from the cache latch included in the second page buffer to the main latch included in the second page buffer.

5. The memory device of claim 2, wherein, when a distance between the first page buffer and the control logic is relatively shorter than that between the second page buffer and the control logic, the bus precharge controller sets a power voltage applied to the bus when data is transmitted from the cache latch included in the first page buffer to the main latch included in the first page buffer to be relatively lower than that applied to the bus when data is transmitted from the cache latch included in the second page buffer to the main latch included in the second page buffer.

6. The memory device of claim 2, wherein the control logic further includes a delay time controller configured to control a precharge delay time that is a time from a point of time when data stored in any one of the main latches is stored in the memory cell array to a point of time when the precharge of the bus is re-started.

7. The memory device of claim 6, wherein the bus precharge controller generates the bus precharge signal, after the precharge delay time elapses.

8. A memory device comprising:
 a memory cell array including a plurality of memory cells configured for storing data;
 first and second page buffers respectively including main latches and cache latches, which are coupled to a bus, the first and second page buffers being connected to the memory cell array respectively through bit lines coupled to the main latches; and
 control logic including a latch controller configured to generate an evaluation signal and an acquisition signal, which are used to transmit data stored in any one of the cache latches to any one of the main latches, based on positions of the first page buffer and the second page buffer.

9. The memory device of claim 8, wherein the evaluation signal is a signal applied to a gate of an evaluation transistor coupled to each of the cache latches to transmit or receive the data through the evaluation transistor, and
 the acquisition signal is a signal applied to a gate of an acquisition transistor coupled to each of the main latches to transmit or receive the data through the acquisition transistor.

10. The memory device of claim 9, wherein, when a distance between the first page buffer and the control logic is relatively shorter than that between the second page buffer and the control logic, the latch controller controls an evaluation time that is a time for which the evaluation time is applied to the gate of the evaluation transistor, when data is transmitted from the cache latch included in the first page buffer to the main latch included in the first page buffer, to be relatively shorter than that of the second page buffer.

11. The memory device of claim 9, wherein, when a distance between the first page buffer and the control logic is relatively shorter than that between the second page buffer and the control logic, the latch controller controls an acquisition time that is a time for which the acquisition time is applied to the gate of the acquisition transistor, when data is transmitted from the cache latch included in the first page buffer to the main latch included in the first page buffer, to be relatively shorter than that of the second page buffer.

12. The memory device of claim 8, wherein the control logic further includes a delay time controller configured to control an evaluation delay time that is a time from a point of time when precharge of the bus is ended to a point of time when transmission of data stored in any one of the cache latches through the bus is started.

13. The memory device of claim 12, wherein the latch controller generates the evaluation signal and the acquisition signal, after the evaluation delay time elapses.

14. A method for operating a memory device, the method comprising:
 receiving data to be stored in a plurality of memory cells included in a memory cell array;
 setting a voltage level of a bus precharged to transmit data stored in any one of cache latches to any one of main latches, based on positions of first and second page buffers, wherein the first and second page buffers respectively include the main latches and the cache latches, which are coupled to the bus, and are coupled to the memory cell array respectively through bit lines coupled to the main latches; and
 generating a power voltage applied to the bus and a bus precharge signal for turning on a bus precharge transistor coupled to the bus, according to the voltage level of the bus.

15. The method of claim 14, wherein, in the generating of the power voltage and the bus precharge signal,
 when a distance between a control logic for controlling the first and second page buffers and the first page buffer is relatively shorter than that between the control logic and the second page buffer, the bus precharge signal is generated such that a time for which the power voltage is applied when data is transmitted from the cache latch included in the first page buffer to the main latch included in the first page buffer is set relatively shorter than that for which the power voltage is applied when data is transmitted from the cache latch included in the second page buffer to the main latch included in the second page buffer.

16. The method of claim 14, wherein, in the generating of the power voltage and the bus precharge signal,
 when a distance between a control logic for controlling the first and second page buffers and the first page buffer is relatively shorter than that between the control logic and the second page buffer, a power voltage applied to the bus when data is transmitted from the cache latch included in the first page buffer to the main latch included in the first page buffer is set relatively lower than that applied to the bus when data is transmitted from the cache latch included in the second page buffer to the main latch included in the second page buffer.

17. The method of claim 14, further comprising generating an evaluation signal and an acquisition signal, which are used to transmit data stored in any one of the cache latches to any one of the main latches, based on positions of the first page buffer and the second page buffer,
 wherein the evaluation signal is a signal applied to a gate of an evaluation transistor coupled to each of the cache latches, and
 the acquisition signal is a signal applied to a gate of an acquisition transistor coupled to each of the main latches.

18. The method of claim 17, wherein, in the generating of the evaluation signal and the acquisition signal,
 when a distance between the control logic and the first page buffer is relatively shorter than that between the control logic and the second page buffer, the evaluation signal is generated such that an evaluation time that is a time for which the evaluation signal is applied to the gate of the evaluation transistor, when data is transmitted from the cache latch included in the first page buffer to the main latch included in the first page buffer, is set relatively shorter than that of the second page buffer.

19. The method of claim 17, wherein, in the generating of the evaluation signal and the acquisition signal,
when a distance between the control logic and the first page buffer is relatively shorter than that between the control logic and the second page buffer, the acquisition signal is generated such that an acquisition time that is a time for which the acquisition signal is applied to the gate of the acquisition transistor, when data is transmitted from the cache latch included in the first page buffer to the main latch included in the first page buffer, is set relatively shorter than that of the second page buffer.

20. The method of claim 17, further comprising controlling an evaluation delay time that is a time from a point of time when precharge of the bus is ended to a point of time when transmission of data stored in any one of the cache latches through the bus is started.

* * * * *